United States Patent
Akimoto et al.

(10) Patent No.: US 8,408,158 B2
(45) Date of Patent: *Apr. 2, 2013

(54) COATING/DEVELOPING DEVICE AND METHOD

(75) Inventors: Masami Akimoto, Kikuchi-gun (JP); Shinichi Hayashi, Kikuchi-gun (JP); Yasushi Hayashida, Kikuchi-gun (JP); Nobuaki Matsuoka, Kikuchi-gun (JP); Yoshio Kimura, Kikuchi-gun (JP); Issei Ueda, Kikuchi-gun (JP); Hikaru Ito, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 2336 days.

This patent is subject to a terminal disclaimer.

(21) Appl. No.: 11/276,662

(22) Filed: Mar. 9, 2006

(65) Prior Publication Data

US 2006/0201423 A1  Sep. 14, 2006

(30) Foreign Application Priority Data

Mar. 11, 2005 (JP) ................... 2005-069723

(51) Int. Cl.
| B05C 11/10 | (2006.01) |
| G03D 15/02 | (2006.01) |
| G03D 5/04  | (2006.01) |

(52) U.S. Cl. ........ 118/695; 118/696; 118/698; 414/935; 414/936; 414/937; 414/938; 414/939; 414/940; 414/941; 396/611

(58) Field of Classification Search .......... 118/695, 118/696, 698; 414/935, 936, 937, 938, 939, 414/940, 941; 396/611
See application file for complete search history.

(56) References Cited

U.S. PATENT DOCUMENTS

| 6,290,405 | B1 * | 9/2001 | Ueda ............................ 396/611 |
| 6,875,281 | B2 * | 4/2005 | Kitano et al. ................ 118/719 |
| 7,145,643 | B2 * | 12/2006 | Auer-Jongepier et al. ..... 355/72 |
| 7,241,061 | B2 * | 7/2007 | Akimoto et al. .............. 396/611 |
| 7,245,348 | B2 * | 7/2007 | Akimoto et al. ................ 355/27 |
| 7,267,497 | B2 * | 9/2007 | Akimoto et al. .............. 396/611 |
| 7,281,869 | B2 * | 10/2007 | Akimoto et al. .............. 396/611 |
| 7,322,756 | B2 * | 1/2008 | Akimoto et al. .............. 396/611 |
| 2004/0005149 | A1 * | 1/2004 | Sugimoto et al. ............ 396/564 |
| 2005/0061247 | A1 * | 3/2005 | Shibata et al. ................ 118/719 |
| 2005/0129839 | A1 * | 6/2005 | Numakura ....................... 427/58 |

FOREIGN PATENT DOCUMENTS

| JP | 2000-331922 | 11/2000 |
| JP | 3337677 | 8/2002 |
| JP | 2004-193597 | 7/2004 |
| JP | 2004-214290 | 7/2004 |
| JP | 2004-311714 | 11/2004 |
| WO | WO 03/098684 A1 * | 11/2003 |

* cited by examiner

Primary Examiner — George Koch

(74) Attorney, Agent, or Firm — Oblon, Spivak, McClelland, Maier & Neustadt, L.L.P.

(57) ABSTRACT

A coating/developing device includes a processing block having a plurality of coating unit blocks stacked and a developing unit block stacked on the coating unit blocks. Each of the unit blocks is provided with a liquid processing unit for coating a liquid chemical on a substrate, a heating unit for heating the substrate, a cooling unit for cooling the substrate and a transfer unit for transferring the substrate between the units. The liquid processing unit is provided with a coating unit for coating a resist liquid on the substrate, a first bottom antireflection coating (BARC) forming unit for coating a liquid chemical for a BARC on the substrate before the resist liquid is coated thereon, and a second BARC forming unit for coating a liquid chemical for the BARC on the substrate after the resist liquid is coated thereon.

19 Claims, 12 Drawing Sheets

FIG.5

| | | | | |
|---|---|---|---|---|
| B5 | COL 51 | CHP 51 | CHP 52 | WEE |
| | COL 52 | COL 53 | CHP 53 | ADH |
| B4 | COL 41 | CHP 41 | CHP 42 | WEE |
| | COL 42 | COL 43 | CHP 43 | ADH |
| B3 | COL 31 | CHP 31 | CHP 32 | WEE |
| | COL 32 | COL 33 | CHP 33 | ADH |
| B2 | POST 2 | POST 2 | PEB 2 | PEB 2 |
| | POST 2 | PEB 2 | COL 2 | COL 2 |
| B1 | POST 1 | POST 1 | PEB 1 | PEB 1 |
| | POST 1 | PEB 1 | COL 1 | COL 1 |

COATING/DEVELOPING DEVICE AND METHOD

FIELD OF THE INVENTION

The present invention relates to a coating/developing device and method for coating a resist liquid on a substrate such as a semiconductor wafer and an LCD substrate (a glass substrate for a liquid crystal display) and developing the same after an exposure processing.

BACKGROUND OF THE INVENTION

In a manufacturing process of a semiconductor device or an LCD substrate, a resist pattern is formed on a substrate by using a photolithography technology. This technology includes a series of processes of coating a resist liquid on the substrate such as a semiconductor wafer (hereinafter, referred to as 'wafer'), forming a liquid film on the surface of the wafer, exposing the resist film by using a photo mask and then developing it.

Such processing is generally performed by using a resist pattern forming apparatus including a coating/developing device and an exposure device connected thereto as configured in, e.g., Japanese Patent Laid-open Publication No. 2004-193597. In such an apparatus, as shown in FIG. 12, a carrier 10 containing a plurality of wafers W is loaded in a carrier stage 11 of a carrier block 1A and a wafer in the carrier 10 is transferred to a processing block 1B by a transfer arm 12. Subsequently, the wafer is transferred to a coating unit 13A in the processing block 1B where the resist liquid is coated thereon, and then transferred to an exposure device 1D via an interface block 1C. After having undergone an exposure processing, the wafer is back transferred to a developing unit 13B in the processing block 1B where a developing process is performed thereon, and then returned to the original carrier 10. Reference numerals 14a to 14c in the drawing represent rack units each of which is provided with a heating unit and a cooling unit for respectively heating and cooling the wafer before or after the processing by the coating unit 13A or the developing unit 13B and transfer stages.

Here, the wafer W is transferred by two transfer units 15A and 15B between modules where the wafer W is placed in the processing block 1B, namely, the coating unit 13A, the developing unit 13B and each part of the rack units 14a to 14c. At this time, during the processing, the wafer W is transferred in accordance with a transferring schedule wherein all wafers W to be processed are determined to be transferred to predetermined modules at predetermined timings.

Conventionally, a coating/developing device has been used for forming a certain type of film exclusively, and it has been customarily accepted that another different kind of coating/developing device is expected to be used for forming a correspondingly different type of film. Recently, however, it has become a trend that a single coating/developing device is required to handle many batches, each batch including small quantity production of different kind of films. For example, as for the type of the coating film, there are a case where a bottom antireflection coating ("BARC") is formed on the top and the bottom of the resist film, a case where the BARC is formed only on either the top or the bottom of the resist film, and a case where no BARC is formed on the resist film and it is required to develop a coating/developing device which can be applied to all of the above various cases. In this case, if the coating unit and the developing unit are provided in a same processing block, the number of units provided in a single processing block becomes great and the size of the processing block is increased, thereby resulting in a large occupancy area thereof.

Further, there may occur a trouble such as a case where the modules such as the coating unit 13A and the heating unit or the transfer units 15A and 15B provided in the processing block 1B become out of order, or the wafer W cannot be transferred at a desired time between the transfer units 15A and 15B and the respective modules. In this case, the operations of the transfer units 15A and 15B and hence the coating/developing device are stopped altogether.

When the transfer units 15A and 15B are stopped, the wafers W remain in the respective modules without being taken out. If the wafers W processed by the coating unit 13A are left in the coating unit 13A, the film quality thereof becomes deteriorated so that a desired quality of the resist film cannot be assured when the wafers W are transferred again by the transfer units 15A and 15B. Accordingly, the wafers W, which were left in the respective modules, are retrieved from the device without being used as a final product and are prepared to be recycled by cleaning the coating film thereon with a solution.

Meanwhile, a recent trend towards a faster throughput of the exposure device requires an enhanced processing capability of the coating/developing device matching with the faster throughput capability of the exposure device. To this end, the number of wafers W introduced into a line of the processing block 1B is increased, so that if there occurs a trouble in the processing block 1B, the number of wafers W to be recycled is increased. As a result, the burden of the processing such as a cleaning process, which should be performed to recycle the wafers W, becomes greater. Moreover, the device cannot be operated while retrieving the wafers W, operating for confirming the locations where the trouble occurs and performing a maintenance work, thereby deteriorating the throughput thereof.

In order to enhance the throughput of the coating/developing device, the present inventor has studied an approach for reducing the burden of the transfer units by vertically arranging an area of the modules before the exposure processing and an area of the modules after the exposure processing at up and down positions. Japanese Patent Laid-open Publication No. 3337677 discloses an arrangement in which a coating area and a developing area are vertically disposed at up and down positions and the transfer unit is provided in each of the areas.

Even in such an arrangement, there may also occur the aforementioned trouble such as the malfunction of the modules and the transfer units in the coating areas and the developing area; however, Japanese Patent Laid-open Publication No. 3337677 does not disclose any approach therefor.

SUMMARY OF THE INVENTION

It is, therefore, an object of the present invention to provide a coating/developing device and method capable of operating appropriately by correspondingly responding to the case where the BARC is formed on the top and the bottom of the resist film and the case where the BARC is not formed and further saving the space thereof. Further, it is an object of the present invention to provide a coating/developing device and method capable of suppressing the deterioration of the throughput even when there occurs a trouble in any one of the coating unit blocks.

In accordance with an aspect of the present invention, there is provided a coating/developing device in which a substrate loaded through a carrier into a carrier block is transferred to a processing block where a coating film including a resist film is formed thereon, and is then transferred through an interface block to an exposure device and returned through the interface block to the processing block, the exposed substrate being developed at the processing block and then transferred to the carrier block, wherein: a) the processing block includes a plurality of coating unit blocks stacked and a developing unit block stacked on the coating unit blocks; b) each of the unit blocks includes a liquid processing unit for coating a liquid chemical on the substrate, a heating unit for heating the substrate, a cooling unit for cooling the substrate and a transfer unit for transferring the substrate between the units; and c) the liquid processing unit provided in the coating unit block includes a coating unit for coating a resist liquid on the substrate, a first bottom antireflection coating (BARC) forming unit for coating a liquid chemical for a BARC on the substrate before the resist liquid is coated thereon, and a second BARC forming unit for coating a liquid chemical for the BARC on the substrate after the resist liquid is coated thereon, wherein in each of the coating unit blocks, the processing for forming the coating film including the resist film on the substrate is performed.

The coating/developing device may further include a control unit for controlling the device such that in case there occurs an abnormality in any one of the coating unit blocks, the substrate is not transferred into the abnormal coating unit block while the substrate is allowed to be transferred in the other coating unit blocks.

The coating/developing device may further include a first transfer stage group provided on the side of the carrier block in each of the unit blocks, the first transfer stage group including first transfer stages stacked which are used in transferring the substrate between the transfer units of the respective unit blocks; and a first substrate transfer unit for transferring the substrate between the first transfer stages. Furthermore, the coating/developing device may further include a second transfer stage group provided on the side of the interface block in each of the unit blocks, the second transfer stage group including second transfer stages stacked which are used in transferring the substrate between the transfer units of the respective unit blocks; and a second substrate transfer unit for transferring the substrate between the second transfer stages.

The first transfer stage group may include a transfer stage for the transfer of the substrate between the carrier block and the processing block, and the second transfer stage group may include a transfer stage for the transfer of the substrate between the interface block and the processing block.

Further, there is provided between the processing block and the interface block an auxiliary block provided with a unit for performing a process on the substrate before the exposure process after the coating film is formed thereon and/or before and after the developing process after the exposure process. In this case, the unit provided in the auxiliary block includes at least one of a thickness inspection unit for inspecting a thickness of the coating film formed on the substrate in order to inspect the status of the surface of the substrate; a cleaning unit for cleaning the substrate before and/or after the exposure process; a defocus inspection device for detecting misalignment of the pattern caused in the exposure device; a device for detecting a non-uniform coating of the resist liquid; a particle detection device for detecting the number of particles adhered to the substrate; a comet detection device for detecting comets generated on the substrate after the resist coating; a splash back detection device; a defect detection device for detecting defects on the substrate; a residual detection device for detecting resist residuals remaining on the substrate after the developing process; a poor status detection device for detecting a poor status in the coating and/or the developing; a line-width measuring device for measuring a line-width of the resist film formed on the substrate; and an overlap detection device for inspecting an overlap precision between the exposed substrate and a photo mask.

The exposure device may perform an exposure in liquid by forming a liquid layer on the surface of the substrate, and the unit provided in the auxiliary block may be the cleaning unit for cleaning the substrate after the substrate is exposed in liquid. In this case, it is preferable that a coating unit block, for forming a water-repellent protection film on the resist film of the substrate, is further stacked on the coating unit blocks stacked.

In accordance with another aspect of the present invention, there is provided a coating/developing method employed in the aforementioned coating/developing device, the method including the steps of: stopping the transfer of the substrate into one of the coating unit blocks while allowing the substrate to be transferred into the other coating unit blocks, in case there occurs an abnormality in the same one of the coating unit blocks.

In accordance with the present invention, since there are provided the stacked coating unit blocks each of which includes the coating unit, the first BARC forming unit and the second BARC coating unit, each of the coating unit blocks can properly operate by correspondingly responding to a case where the BARC is either formed or not on the top and the bottom of the resist film while saving the space occupied by the processing block. Accordingly, the space can be efficiently used.

Further, even when there occurs an abnormality in any one of the coating unit blocks, the coating film can be formed by using the other coating unit blocks. Therefore, the overall apparatus need not be stopped, thereby suppressing the deterioration of the throughput compared with a case where the overall apparatus is stopped. In addition, the number of the wafers W remaining in the unit block where the abnormality occurs becomes small by distributing the coating works to the plural coating unit blocks, thereby decreasing the burden of processing the substrates in order to recycle them.

BRIEF DESCRIPTION OF THE DRAWINGS

The above and other objects and features of the present invention will become apparent from the following description of preferred embodiments, given in conjunction with the accompanying drawings, in which:

FIG. 5 presents a front view of the rack unit as viewed from a transferring area;

DETAILED DESCRIPTION OF THE PREFERRED EMBODIMENTS

Figure 1:
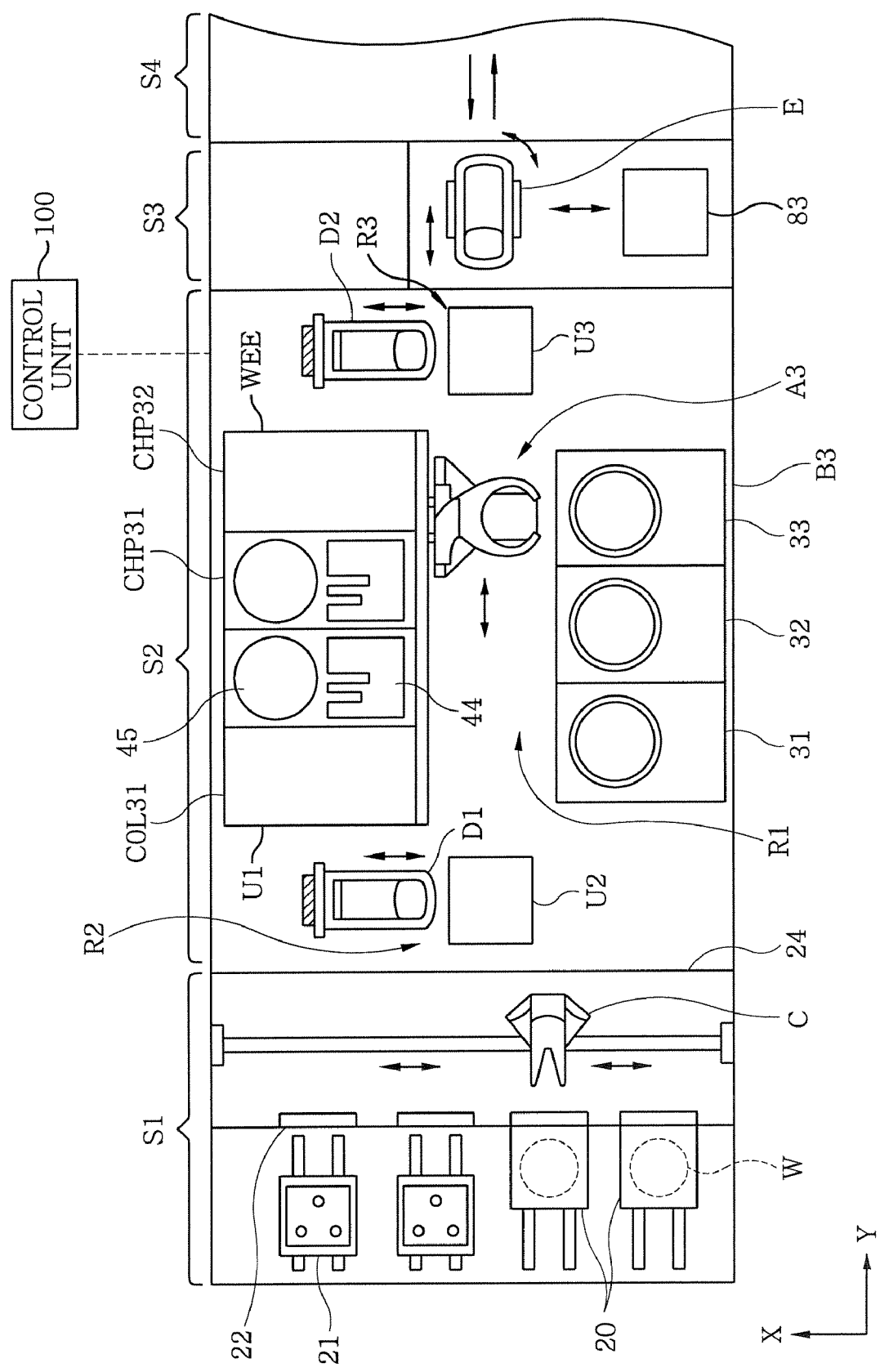
FIG. 1 is a top view of a coating/developing device in accordance with a preferred embodiment of the present invention.
Figure 2:
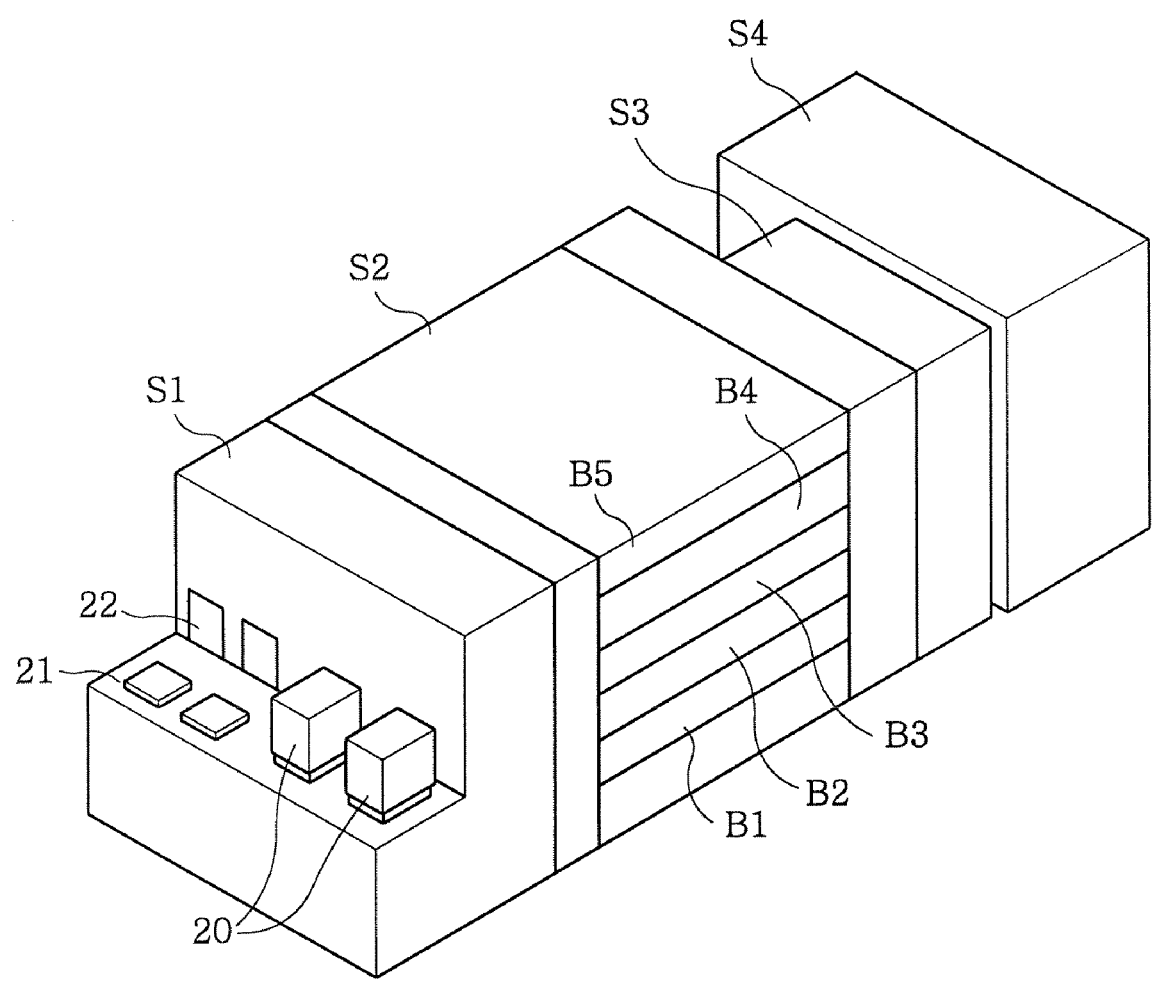
FIG. 2 illustrates a perspective view of the coating/developing device.

Hereinafter, there will be described a coating/developing device in accordance with a first preferred embodiment of the present invention. FIG. 1 is a top view of a resist pattern forming apparatus to which the coating/developing device of the present invention is applied; FIG. 2 illustrates a schematic perspective view thereof; and FIG. 3 describes a schematic side view thereof. Such apparatus includes a carrier block S1 for loading/unloading a carrier accommodating therein, e.g., 13 wafers in a sealing state; a processing block S2 in which a plurality of, e.g., 5, unit blocks B1 to B5 are vertically arranged; an interface block S3; and an exposure device S4.

The carrier block S1 includes a mounting table 21 capable of mounting thereon a plurality of carriers 20, an opening/closing member 22 provided on a front wall as viewed from the mounting table 21 and a transfer arm C for unloading wafers W from the carrier 20 via the opening/closing member 22. The transfer arm C is configured such that it can freely rotate about its vertical axis and move back and forth, up and down and in a direction of arranging the carriers 20 to thereby transfer the wafers W between transfer stages TRS1 and TRS2 of the unit blocks B1 and B2 to be described later.

The processing block S2 surrounded by a housing 24 is connected to the inner side of the carrier block S1. The processing block S2 includes, e.g., 5 unit blocks B1 to B5 stacked vertically, which are in this embodiment divided from the bottom into a first and a second unit block B1 and B2 for performing a developing process and a third to a fifth unit blocks B3 to B5 for coating resist liquid on a wafer W.

The following is a description on a main composition of the first to the fifth unit blocks B1 to B5. Each of the unit blocks B1 to B5 is provided with a liquid processing unit for coating a liquid chemical on the wafer W, various processing units of heating/cooling system for performing a pre-treatment and a post-treatment of the processing by the liquid processing unit, and main arms A1 to A5 as dedicated transfer units for transferring the wafer W between the liquid processing unit and the processing units of heating/cooling system.

In this embodiment, the unit blocks B1 to B5 have a same layout of the liquid processing unit, the processing unit of heating/cooling system and the transfer unit. The same layout means that the centers of the wafers W mounted in the respective processing units, i.e., the centers of spin chucks to be described later in the processing units are aligned with each other and the centers of heating and cooling plates in the respective heating and cooling units are aligned with each other.

Since the unit blocks B1 to B5 are formed in the same layout, the third unit block B3 will now be described in detail as an example with reference to FIG. 4. There is formed a transferring area R1 of the wafer W for connecting the carrier block S1 to the interface block S3 at a substantially central portion of the unit block B3 in a longitudinal direction of the unit block B3 (Y-axis direction in FIG. 4). Further, at the right side of the transferring passage R1 as viewed from the front side (the carrier block S1 side) toward the inner side, there is provided as the liquid processing unit along the transferring area R1 a first bottom antireflection coating ("BARC") forming unit 31 for coating a liquid chemical for the first BARC on the bottom of a resist film, a coating unit 32 for coating a resist liquid on the wafer W and a second BARC forming unit 33 for coating a liquid chemical for the second BARC on the top of the resist film.

Furthermore, at the left side of the transferring area R1 as viewed from the front side (the carrier block S1 side) toward the inner side, there is provided along the transferring passage R1 a rack unit U1 having multi-staged units of heating/cooling system. The rack unit U1 includes various units for performing a pre-treatment and a post-treatment of the processing by the coating unit 32 or the first and the second BARC forming unit 31, 33, which are stacked in two layers and arranged in a plurality of, e.g., four, columns. The transferring area R1 is defined as described above, and the floating of particles in the transferring area R1 is suppressed by injecting a clean air into the area and exhausting it therefrom.

Figure 4:
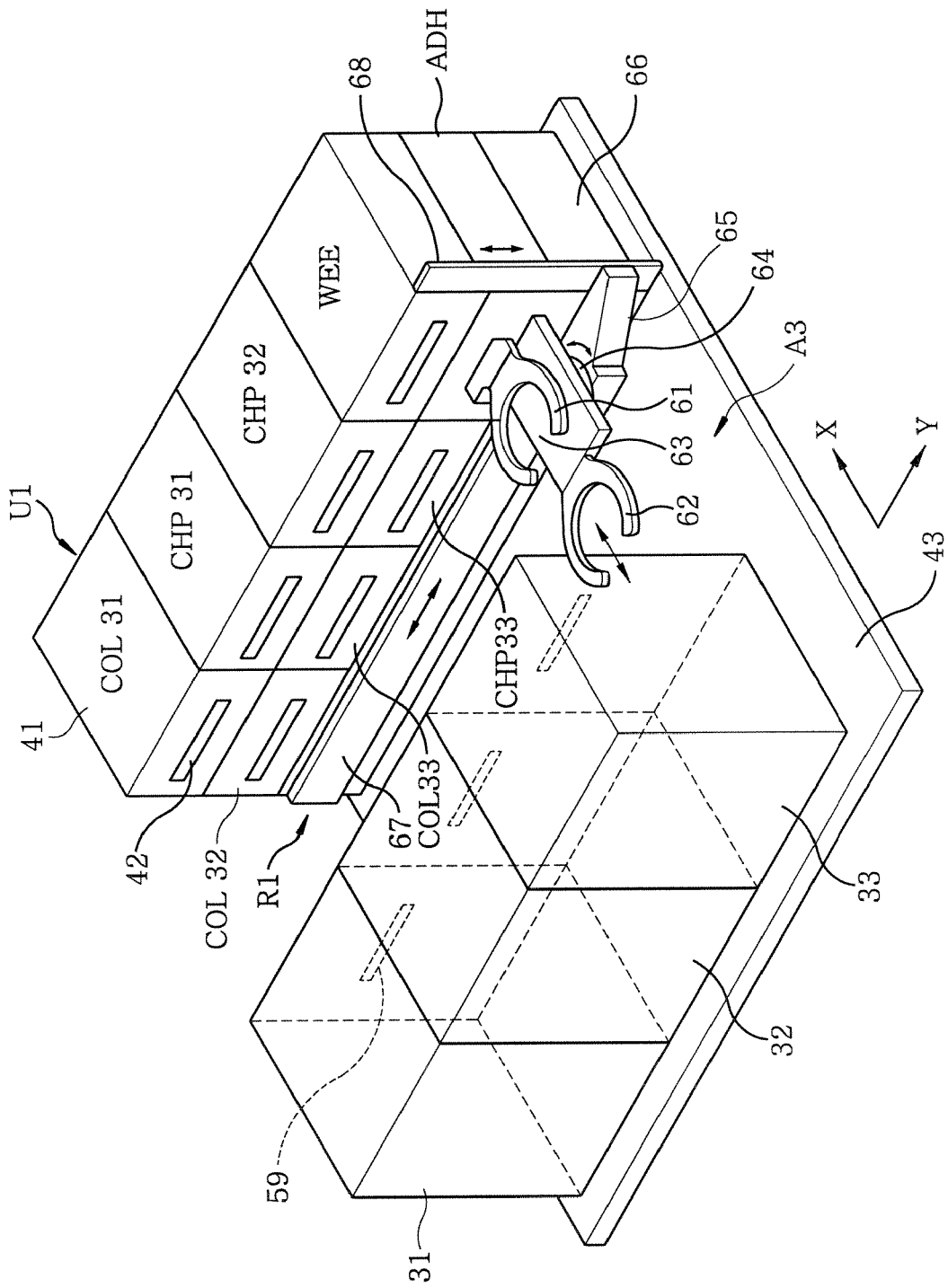
FIG. 4 provides a perspective view of a coating unit, a rack unit, a transfer unit in the coating/developing unit.

The aforementioned various units for performing the pre-treatment and the post-treatment include, as shown in FIGS. 4 and 5 for example, a cooling unit COL31 for adjusting the temperature of the wafer W to a predetermined level before the coating of the liquid chemical for the first BARC; a cooling unit COL32 for adjusting the temperature of the wafer W to a predetermined level before the coating of the resist liquid; a cooling unit COL33 for adjusting the temperature of the wafer W to a predetermined level before the coating of the liquid chemical for the second BARC; a heating unit CHP31 for heating the wafer W after the coating of the liquid chemical for the first BARC; a heating unit CHP32, called as, e.g., a pre-baking unit, for heating the wafer W after the coating of the resist liquid; a heating unit CHP33 for heating the wafer W after the coating of the liquid chemical for the second BARC; a hydrophobic finishing unit ADH for enhancing the adhesivity of the resist liquid to the wafer W; and a peripheral edge exposure device WEE for selectively exposing only an edge portion of the wafer W.

Furthermore, the processing units such as the cooling units COL31 to COL33 and the heating units CFP31 to CHP33 are accommodated in the respective processing vessels 41, and the rack unit U1 includes the processing vessels 41 which are stacked in two layers and are arranged in four columns. Formed at a surface of each processing vessel 41 facing the transferring area R1, is an opening through which the wafer W is loaded thereinto and unloaded therefrom. Reference numeral 43 in FIG. 4 represents a base plate of the corresponding unit block B3 serving as a partition wall between the unit blocks B2 and B3.

The main arm A3 is provided in the transferring area R1. The main arm A3 serves to transfer the wafer W between the modules (where the wafer W is positioned) in the third unit block B3, e.g., between the respective processing units of the rack unit U1, the first and the second BARC forming unit 31, 33, the coating unit 32 and respective parts of rack units U2 and U3 to be described later. To this end, the main arm A3 is configured to be movable back and forth, vertically and in the Y-axis direction and also rotatable about its vertical axis on the base 63.

Figure 3:
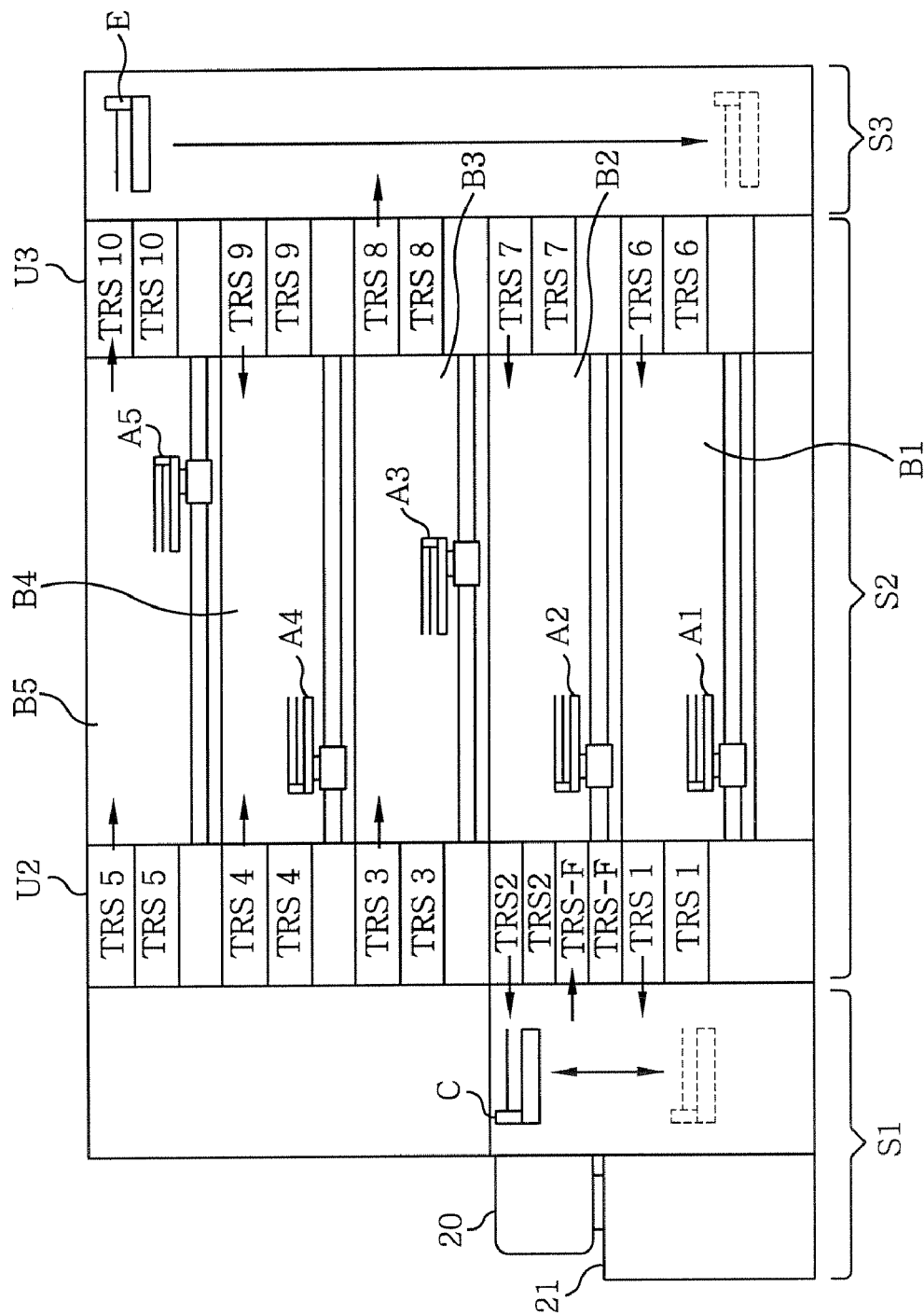
FIG. 3 describes a side sectional view of the coating/developing device.

An area adjacent to the carrier block S1 in the transferring area R1 serves as a first wafer transferring area R2. As shown in FIGS. 1 and 3, there are provided the rack unit U2 at a position in the area R2 where each of the transfer arm C and the main arm A3 can have an access and a first conveyance arm D1 for transferring the wafer W to and from the rack unit U2.

In this embodiment, as shown in FIG. 3, the rack unit U2 includes one or more, e.g., two, transfer stages TRS3 through which the wafer W is transferred between the main arm A3 of the unit block B3 and the main arms A1, A2, A4 and A5 of the other unit blocks B1, B2, B4 and B5. In this embodiment, as shown in FIG. 3, the unit blocks B1 to B5 include at the rack unit U2 one or more, e.g., two, first transfer stages of each of TRS1 to TRS5, respectively. In this way, in the rack unit U2, the first transfer stages stacked in multi-layers form a first transfer stage group. In addition, the first conveyance arm D1 can freely move back and forth and up and down so that the transfer of the wafer W can be carried out with respect to the first transfer stages TRS1 to TRS5.

In this embodiment, the respective first transfer stages TRS1 and TRS2 of the first and the second unit block B1 and B2 are configured to carry out the transfer of the wafer W to and from the transfer arm C, and correspond to a transfer stage for the carrier block. Further, in this embodiment, the second unit block B2 further includes, e.g., two transfer stages TRS-F as the first transfer stages, and the transfer stages TRS-F are exclusively used for loading the wafer W into the processing block S2 by the transfer arm C. The transfer stage TRS-F corresponds to the transfer stage for the carrier block, and may be provided in the first unit block B1. Still further, instead of providing the separate transfer stages TRS-F, the wafer W may be loaded into the processing block S2 with the transfer arm C by using the transfer stages TRS1 and TRS2.

Further, an area adjacent to the interface block S3 in the transferring area R1 serves as a second wafer transferring area R3. As illustrated in FIGS. 1 and 3, there are provided the rack unit U3 at a position where the main arm A3 can have an access and a second conveyance arm D2 for transferring the wafer W to and from the rack unit U3.

Figure 6:
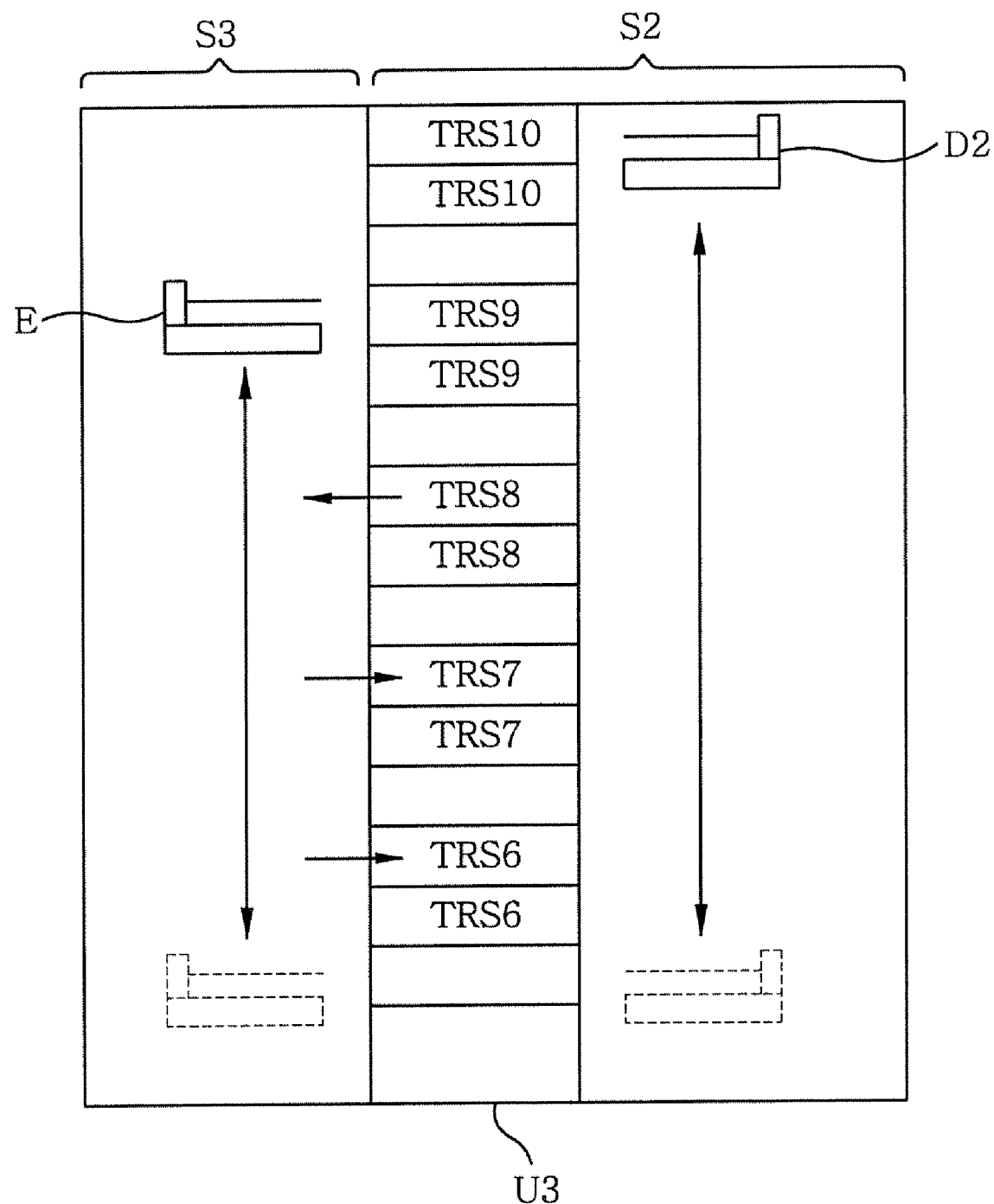
FIG. 6 sets forth a side sectional view of a processing block and the interface block in the coating/developing device.

As depicted in FIGS. 3 and 6, the rack unit U3 includes one or more, e.g., two, transfer stages TRS8 through which the wafer W is transferred between the main arm A3 of the unit block B3 and the main arms A1, A2, A4 and A5 of the other unit blocks B1, B2, B4 and B5. In this embodiment, the unit blocks B1 to B5 include at the rack unit U2 one or more, e.g., two, second transfer stages of each of TRS6 to TRS10, respectively. In this way, in the rack unit U3, the second transfer stages stacked in multi-layers form a second transfer stage group. In addition, the second conveyance arm D2 can freely move back and forth and up and down so that the transfer of the wafer W can be carried out with respect to the second transfer stages TRS6 to TRS10.

As described above, in this embodiment, the first transfer area R2 wherein the first transfer stages TRS1 to TRS5 and the first conveyance arm D1 are provided and the second transfer area R3 wherein the second transfer stages TRS6 to TRS10 and the second conveyance arm D2 are provided serve as communication areas between the five unit blocks B1 to B5. The regions between the first and the second transfer area R2 and R3, including the transferring area R1, are partitioned by the partition walls between the respective unit blocks. Between the unit blocks B1 to B5 stacked in the five layers, the wafer W can be freely transferred by the first and the second conveyance arm D1 and D2 through the first transfer stages TRS1 to TRS 5 and TRS-F and the second transfer stages TRS6 to TRS10, respectively.

Hereinafter, the other unit blocks will be described briefly with reference to FIGS. 3 and 5. The fourth and the fifth unit block B4 and B5 have the substantially same configuration as that of the third unit block B3. The fourth unit block B4 includes as the liquid processing unit the first BARC forming unit 31, the coating unit 32 and the second BARC forming unit 33. Further, the rack unit U1 in the fourth unit block B4 is provided with cooling units COL41 to COL43 for adjusting the temperature of the wafer W to a predetermined level before the coatings of the liquid chemical for the first BARC, the resist liquid and the liquid chemical for the second BARC, respectively; heating units CHP41 to CHP43 for heating the wafer W after the coatings of the liquid chemical for the first BARC, the resist liquid and the liquid chemical for the second BARC, respectively; a hydrophobic finishing unit ADH; and a peripheral edge exposure device WEE. In the fourth unit block B4, the wafer W is transferred by the main arm A4 between the first transfer stages TRS4, the second transfer stages TRS9, the first and the second BARC forming unit 31 and 33, the coating unit 32 and the respective processing units of the rack unit U1.

Besides, the fifth unit block B5 includes as the liquid processing unit the first BARC forming unit 31, the coating unit 32 and the second BARC forming unit 33. Further, the rack unit U1 in the fifth unit block B5 is provided with cooling units COL51 to COL53 for adjusting the temperature of the wafer W to a predetermined level before the coatings of the liquid chemical for the first BARC, the resist liquid and the liquid chemical for the second BARC, respectively; heating units CHP51 to CHP53 for heating the wafer W after the coatings of the liquid chemical for the first BARC, the resist liquid and the liquid chemical for the second BARC, respectively; a hydrophobic finishing unit ADH; and a peripheral edge exposure device WEE. In the fifth unit block B5, the wafer W is transferred by the main arm A5 between the first transfer stages TRS5, the second transfer stages TRS10, the first and the second BARC forming unit 31 and 33, the coating unit 32 and the respective processing units of the rack unit U1.

In addition, the first and the second unit block B1 and B2 are structured identical to each other and have the substantially same configuration as that of the third unit block B3 except that there is provided a developing unit for performing a developing process on the wafer W as the liquid processing unit and the rack unit U1 thereof is provided with heating units PEB1, PEB2 called as, e.g., a post exposure baking unit, for heating the wafer W after the exposure, and cooling units COL1, COL2 for adjusting the temperature of the wafer W to a predetermined level after the processing by the heating units, and heating units POST1, POST2 called as, e.g., a post baking unit for heating the wafer W to evaporate moisture therein after the developing process.

In the first and the second unit block B1 and B2, the wafer W is transferred by the respective main arms A1 and A2 to and from the first transfer stage TRS1, TRS2, TRS-F, the second transfer stage TRS6, TRS7, the developing unit, the processing units of the rack unit U1.

Meanwhile, in the unit blocks B1 and B2 for the developing process, by eliminating the partition wall therebetween, the wafer W may be transferred by one main arm A1 to and from the first transfer stages TRS1, TRS2, TRS-F, the second transfer stages TRS6, TRS7, the developing unit of the unit blocks B1 and B2, the processing units of the rack unit U1.

Further, FIG. 5 indicates an exemplary layout of the processing units. However, there may be provided processing units other than the heating units CHP, PEB and POST, the cooling units COL, the hydrophobic finishing unit ADH and the peripheral edge exposure device WEE. In an actual apparatus, the number of the processing units is determined based on the processing time thereof.

Meanwhile, the exposure device S4 is connected via the interface block S3 to the inner side of the rack unit U3 in the processing block S2. The interface block S3 includes an interface arm E for transferring the wafer W between the rack unit U3 of the processing block S2 and the exposure device S4 and a buffer 83 for supporting a plurality of wafers W in a rack pattern. The interface arm E, which serves as a transfer mechanism of the wafer W interposed between the processing block S2 and the exposure device S4, is freely movable back and forth, up and down and in the X-axis direction, and rotatable about its vertical axis to transfer the wafer W with respect to the second transfer stages TRS6 to TRS10 of the unit blocks B1 to B5 and each portion of the buffer 83 in this embodiment. In this embodiment, the second transfer stages TRS6 to TRS10 correspond to the transfer stages for the interface block.

The buffer 83 is used, e.g., in a case where the wafers W subjected to the coating process are stocked during the throughput control of the exposure device S4 and that of the processing block S2 or during the change of the exposure condition and then sequentially transferred to the exposure device S4. By using the buffer as described above, it is possible to make the coating/developing device match with the throughput of the exposure device S4 and to perform the exposure process after changing the exposure condition such as an exposure intensity and a mask species appropriately for each lot. Further, it is possible to continue the coating process even while changing the exposure condition, thereby increasing the productivity thereof.

The interface arm E may be configured to transfer the wafer W to and from the second transfer stages of a specified one among the unit blocks B1 to B5. In this case, the second transfer stages where the interface arm E can have an access correspond to the transfer stages for the interface block.

Figure 7A:
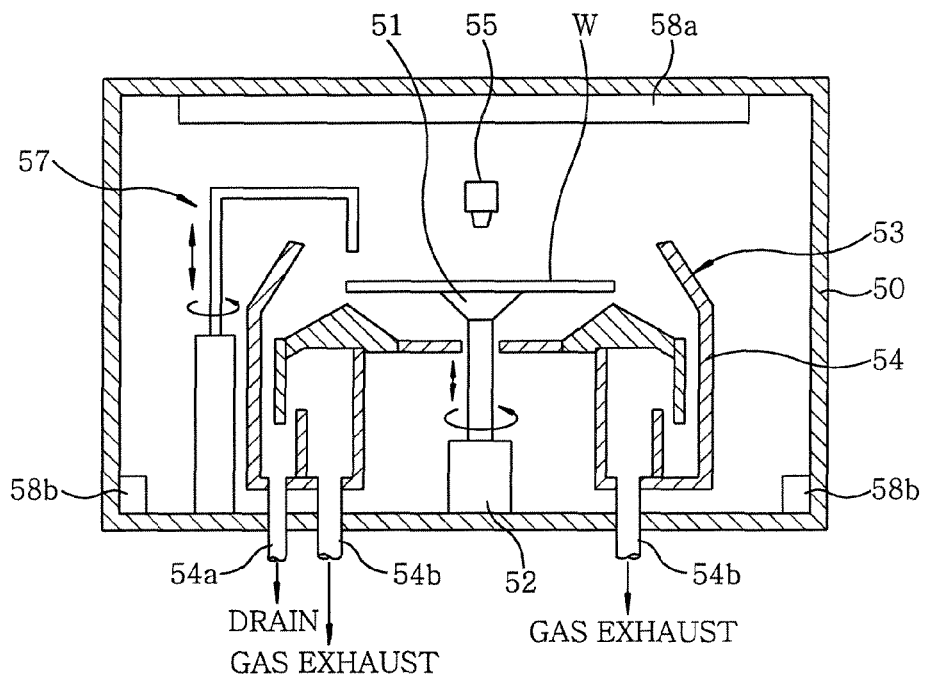
FIGS. 7A and 7B depict a side sectional view and a top view of the coating unit in the coating/developing device, respectively.
Figure 7B:
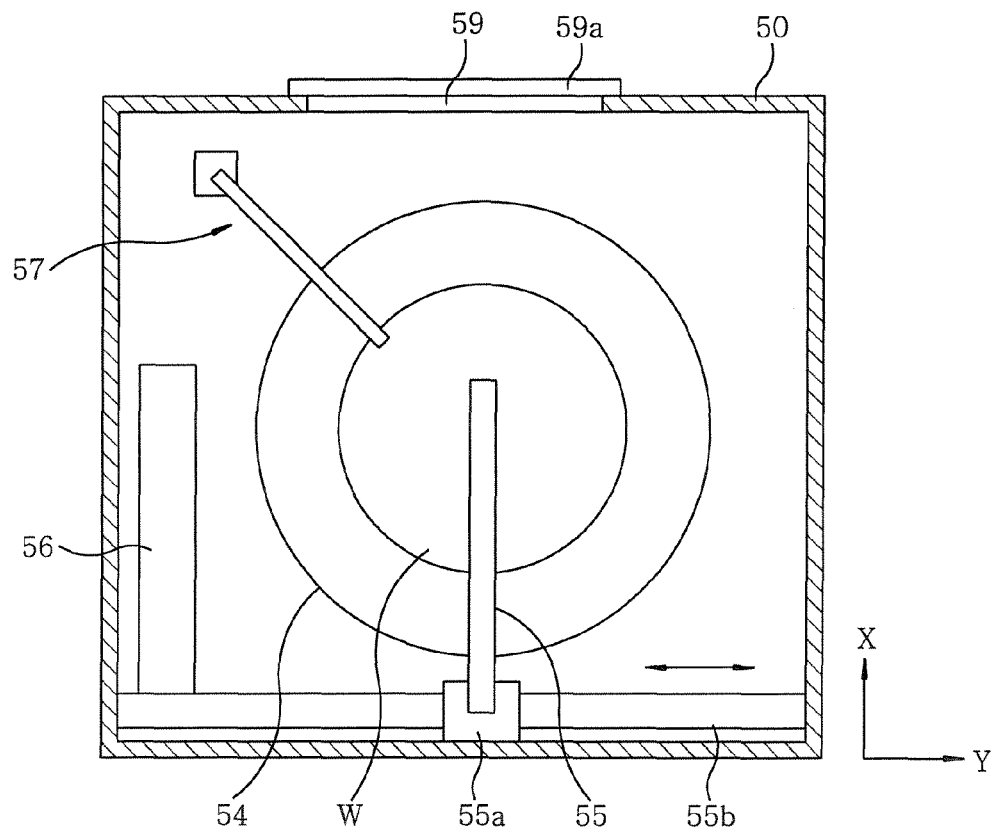

Hereinafter, there will be briefly described the configurations of the main arms A1 to A5, the first and the second conveyance arm D1 and D2 and the interface arm E. First, as for the liquid processing unit, the coating unit 32 will be described briefly as an example with reference to FIGS. 7A and 7B.

Reference numeral 51 denotes a spin chuck serving as a supporting unit for supporting a substrate accommodated in a processing vessel 50, the spin chuck horizontally supporting the wafer W by a vacuum-adsorption. The spin chuck 51 can freely move up and down and rotate about its vertical axis by a driving unit 52. Further, a cup 53 is provided to surround the wafer W and the spin chuck 51, the cup 53 having a liquid receiving portion 54 wherein an inner and an outer area are partitioned. Connected to the bottom wall of the outer area of the liquid receiving portion 54 is a drain line 54a for draining, e.g., the coating liquid received therein. Two gas exhaust lines 54b are connected to the bottom wall of the inner area of the liquid receiving portion 54. Although not shown, elevation pins are provided to move up and down while supporting the backside of the wafer W. The elevation pins and the main arm A cooperate with each other to transfer the wafer W to and from the spin chuck 51.

Reference numeral 55 indicates a liquid chemical nozzle for supplying the coating liquid (resist liquid) to the wafer W. The liquid chemical nozzle 55 can freely move along a guide rail 55b extended in the Y direction from one end of the processing vessel 50 to the other end thereof and also move up and down by a driving unit 55a.

Reference numeral 57 denotes a side rinse mechanism for supplying a rinse liquid to the peripheral portion of the wafer W supported by the spin chuck 51. The side rinse mechanism can freely move up and down and rotate about its vertical axis. Further, reference numeral 58a represents a filter unit attached at the ceiling portion of the processing vessel 50, and reference numeral 58b indicates an exhaust unit provided at the bottom wall of the processing vessel 50. By exhausting the air in the processing vessel 50 at a predetermine flow rate through the exhaust unit 58b while supplying a clean gas whose temperature and humidity are adjusted, a down flow of the clean air is formed therein, thereby maintaining the pressure therein at a positive level greater than that in the transferring area R1. Reference numeral 59 denotes a loading/unloading opening formed in a surface of the processing vessel 50 facing the transferring area R1, through which the wafer W is loaded into and unloaded from the processing vessel 50. The loading/unloading opening 59 can be freely opened and closed by an openable/closable shutter 59a.

In such a coating unit 32, the wafer W is loaded by the main arms A1 to A5 into the processing vessel 50 through the opening 59 and transferred onto the spin chuck 51 disposed above the cup 53 by the cooperation of the elevation pins (not shown) and the main arms A1 to A5. The spin chuck 51 is then lowered to a processing position. Thereafter, the spin chuck 51 is rotated while the resist liquid is supplied from the liquid chemical nozzle 55 onto the central portion of the wafer W, so that the resist liquid is radially spread by a centrifugal force to form a resist liquid film on the surface of the wafer W. The wafer, on which the resist liquid film is formed, is then unloaded by the main arms A1 to A5 out of the coating unit 32 through the opening 59.

The first and the second BARC forming unit 31 and 33, for respectively coating a liquid chemical for the BARC on the wafer W before and after the coating of the resist liquid, have the substantially same configuration as that of the coating unit 32 except that the liquid chemical for the BARC is supplied from the liquid chemical nozzle. In the coating unit blocks B3 to B5 for forming the coating film, the first and the second BARC forming unit 31, 33 and the coating unit 32 are accommodated in the processing vessel 50 and disposed on the common base plate 43 to face the transferring area R1 in the transverse direction (Y-axis direction).

In the developing unit blocks B1, B2, as the liquid processing unit, three developing units are arranged in the transverse direction (Y-axis direction) to face the transferring area R1. The developing units have a substantially same configuration as that of the coating unit except that a developing liquid supply area is formed throughout the lengthwise direction of the liquid chemical nozzle, the developing liquid is supplied in a diameter direction of the wafer W and a cleaning liquid nozzle is provided. The cleaning liquid nozzle has a same configuration as that of the liquid chemical nozzle, and can be freely moved up and down and along the guide rail by the moving unit to supply a cleaning liquid to the wafer W supported on the spin chuck.

In such a developing unit, the wafer W is loaded by the main arms A1 to A5 into the processing vessel through the loading/unloading opening to be transferred onto the spin chuck. Then, the developing liquid is supplied from the liquid chemical nozzle onto the central portion of the wafer W while the wafer W is rotated by the spin chuck, so that the developing liquid is supplied to an entire surface of the wafer W. After a predetermined time period has elapsed, the cleaning liquid is supplied from the cleaning liquid nozzle onto the wafer W to wash the developing liquid off the surface of the wafer, and the wafer W is dried by rotating and the developing process is then completed.

In the developing unit, instead of providing the separate cleaning liquid nozzle, a cleaning mechanism of the same configuration as that of the side rinse mechanism 57 of the coating unit 32 may be provided such that it can move up and down and rotate about its vertical axis to supply the cleaning liquid to the central portion of the wafer W supported by the spin chuck.

Further, as shown in FIG. 4, each of the main arms A1 to A5 includes two arms 61, 62 for supporting the peripheral portion of the backside of the wafer W and the arms 61, 62 are configured to be independently movable back and forth on the base 63. Further, the base 63 can be rotated about its vertical axis by a rotation mechanism 64 and moved by a moving mechanism 65 up and down along an elevation rail 68 and in the Y-axis direction along a Y-axis rail 67 attached to a surface of a support 66 for supporting the rack unit U1, which faces the transferring area R1. In this way, the arms 61, 62 are configured to be movable up and down, back and forth and in the Y-axis direction and rotatable about the vertical axis, to thereby transfer the wafer W between the respective units of the rack unit U1, the first and the second transfer stages and the liquid processing units. The movements of the main arms A1 to A5 are controlled by a controller (not shown) in response to instructions from a control unit to be described later. Furthermore, in order to prevent heat at the heating units from accumulating at the arms, the sequence of receiving the wafer W can be controlled appropriately.

Figure 8:
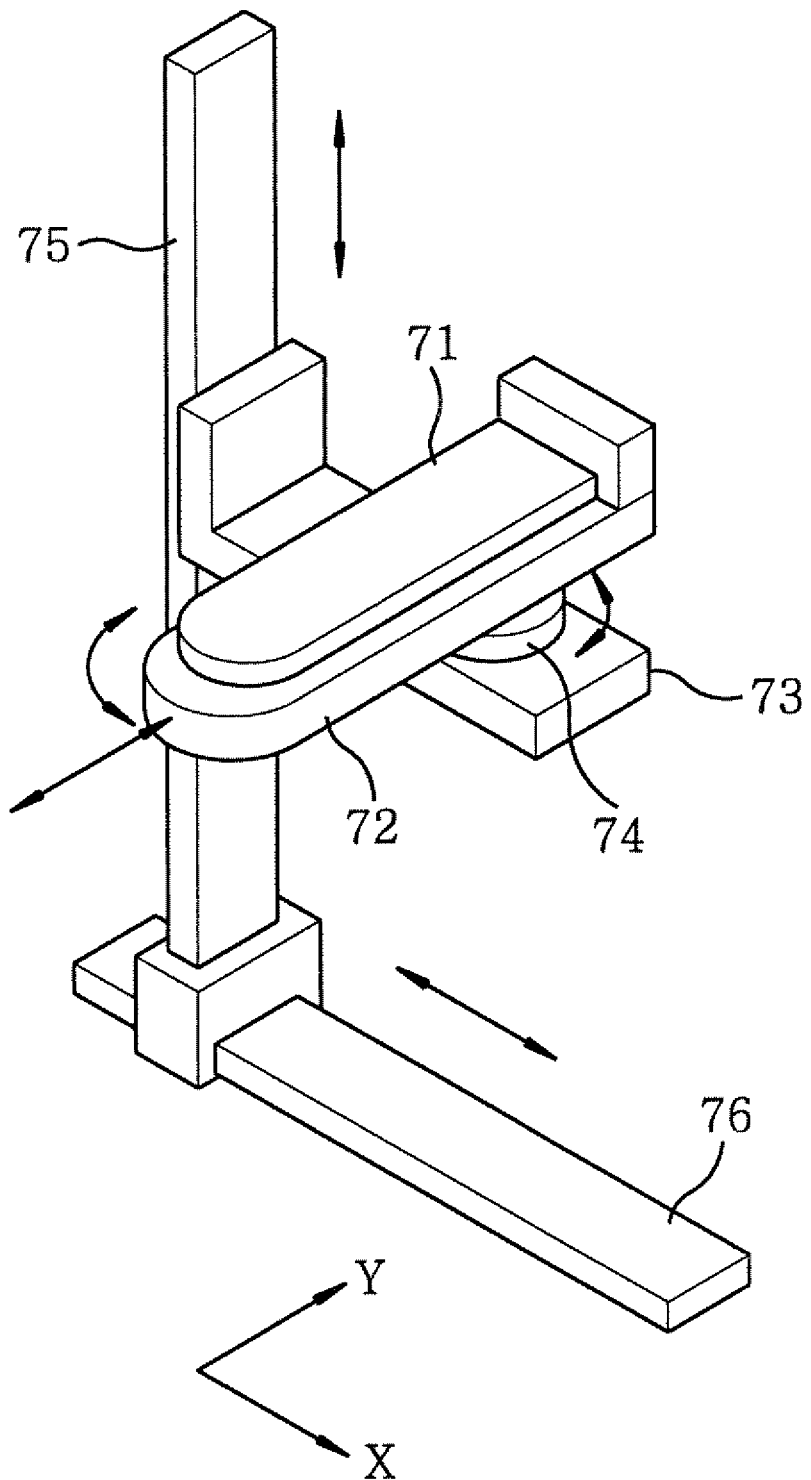
FIG. 8 represents a perspective view of an exemplary interface arm in the coating/developing device.

Moreover, as shown in FIG. 8, the interface arm E is provided with an arm 71 for supporting the central portion of the backside of the wafer W, the arm 71 being movable back and forth on a base 72. The base 72 is rotatably attached to an elevation base 73 to be rotated about its vertical axis by a rotation mechanism 74 which is movable up and down along an elevation rail 75. Further, for example, the elevation rail 75 is provided to be movable in the X-axis direction along an X-axis rail 76. In this way, the arm 71 is configured to be movable up and down, back and forth and in the X-axis direction and rotatable about the vertical axis, to thereby transfer the wafer W between the second transfer stages TRS6 to TRS10, the rack unit U3 and the buffer 83.

The first and the second conveyance arms D1, D2 have a same configuration as that of the interface arm E except that they do not rotate about their vertical axes and move in the X-axis direction. The movements of the first and the second conveyance arms D1, D2 and the interface arm E are controlled by the controller (not shown) in response to instructions from the control unit to be described later.

As the heating units CHP31 to CHP53, POST1 and POST2, and PEB1 and PEB2, as shown in FIG. 1, there is used a unit capable of performing the heating and the cooling in a single unit, which includes a heating plate 45 and a cooling plate 44 also serving as the transfer arm to transfer the wafer W between the main arms A1 to A5 and the heating plate 45. Further, as the cooling unit COL1 to COL53, there is used a unit including, e.g., a water cooling type of cooling plate. In addition, the hydrophobic finishing unit performs a gas processing under an HMDS atmosphere.

The aforementioned resist pattern forming apparatus includes the control unit 100 having a computer for preparing and managing a process recipe depending on a target coating film and/or a transfer recipe showing the transferring paths of the wafer W, and controlling the movements of the main arms A1 to A5, the transfer arm C, the first and the second transfer arm D1, D2 and the interface arm E.

In the present invention, there are provided the first and the second developing unit block B1, B2 and the third to the fifth coating unit blocks B3 to B5. In the coating unit blocks B3 to B5, a series of processes for forming the coating film are completed for each of unit blocks B3 to B5. Further, in the developing unit blocks B1, B2, a series of processes are completed for each unit block.

The above transfer recipe is prepared by describing the wafer transferring paths in the coating unit blocks B3 to B5 and in the developing unit blocks B1, B2 in the sequence of using the modules, depending on the types of the target coating film. Accordingly, a plurality of transfer recipes for each coating film is stored in the control unit 100. The types of the coating film are determined depending on the cases where the BARC is formed on the top and the bottom of the resist film, the BARC is formed on any one of the top and the bottom of the resist film, no BARC film is formed, the kind of the resist film and/or the BARC is changed, and the thickness of the resist film and/or the BARC is changed. The same coating films indicate that the kind and the thickness of the resist film and/or the BARC thereof are same and the processing conditions (processing temperature and the processing time) thereof in the heating units and the cooling units are same. The coating films, which do not meet the above conditions, are considered as different ones.

In this way, the control unit 100 selects a desired transfer recipe depending on the type of the coating film to be formed from the plural transfer recipes, so that a series of processes are performed in such a way that the coating unit blocks B3 to B5 and the developing unit blocks B1 and B2, to which the wafer W is transferred, are designated and the wafer W is transferred along a desired transferring path in the designated unit blocks B1 to B5.

Hereinafter, the operation of the resist pattern forming apparatus will be described by taking as an example a case where a first coating film is formed on wafers WA of a lot A which are transferred in accordance with a transfer recipe A in the third unit block B3, a second coating film is formed on wafers WB of a lot B which are transferred in accordance with a transfer recipe B in the fourth unit block B4, and a third coating film is formed on wafers WC of a lot C which are transferred in accordance with a transfer recipe C in the fifth unit block B5.

Prior to performing the processing, the operator selects the lot of the wafers W and the transfer recipe corresponding thereto. Specifically, the transfer recipe A (whereby the first coating film is formed in the third unit block B3) is selected for the wafers WA of the lot A, the transfer recipe B (whereby the second coating film is formed in the fourth unit block B4) is selected for the wafers WB of the lot B, and the transfer recipe C (whereby the third coating film is formed in the fifth unit block B5) is selected for the wafers WC of the lot C, so that the wafers W of the lots A, B and C are sequentially taken out by the transfer arm C. Here, each of the transfer recipes also includes the transferring paths in the unit blocks B1, B2 upon the developing process.

In this embodiment, the first coating film means that the BARC is formed on the top and the bottom of the resist film, the second coating film means that the BARC is formed on the top of the resist film, and the third coating film means that the BARC is formed on the bottom of the resist film. At this time, the first to the third coating film have different resists, respectively, and the heating temperatures at the heating units and the cooling temperatures at the cooling units are different for the first to the third coating film.

First, carriers 20A to 20C accommodating the respective wafers WA to WC of the lots A to C are loaded into the carrier block S1, and the wafers WA to WC are sequentially taken out from the respective carriers 20A to 20C by the transfer arm C.

The wafers WA to WC are sequentially transferred to the first transfer stage TRS-F of the rack unit U2 in the processing block S2. Then, the wafer WA is transferred to the main arm A3 of the unit block B3 via the first transfer stage TRS3 by the first conveyance arm D1, the wafer WB is transferred to the main arm A4 of the unit block B4 via the first transfer stage TRS4 by the first conveyance arm D1, and the wafer WC is transferred to the main arm A5 of the unit block B5 via the first transfer stage TRS5 by the first conveyance arm D1.

At the third unit block B3, the wafer WA is transferred by the main arm A3 to the cooling unit COL31, the first BARC forming unit 31 and the heating unit CHP31 in that order to form a first BARC on the surface of the wafer WA. Subsequently, the wafer WA is transferred to the cooling unit COL32, the coating unit 32 and the heating unit CHP32 in that order to form a resist film on the first BARC. The wafer WA is then transferred to the cooling unit COL33, the second BARC forming unit 33, the heating unit CHP33, the peripheral edge exposure device WEE and the second transfer stage TRS8 of the rack unit U3 in that order to form a second BARC on the resist film.

Further, at the fourth unit block B4, the wafer WB is transferred by the main arm A4 to the hydrophobic finishing unit ADH, the cooling unit COL42, the coating unit 32 and the heating unit CHP42 in that order to form a resist film on the surface of the wafer WB. Subsequently, the wafer WB is transferred to the cooling unit COL43, the second BARC forming unit 33, the heating unit CHP43, the peripheral exposure device WEE and the second transfer stage TRS9 of the rack unit U3 in that order to form a second BARC on the resist film.

Moreover, at the fifth unit block B5, the wafer WC is transferred by the main arm A5 to the cooling unit COL51, the first BARC forming unit 31 and the heating unit CHP51 in that order to form a first BARC on the surface of the wafer WC. Subsequently, the wafer WC is transferred to the hydrophobic finishing unit ADH, the cooling unit COL52, the coating unit 32, the heating unit CHP52, the peripheral edge exposure device WEE and the second transfer stage TRS10 of the rack unit U3 in that order to form a second BARC on the resist film.

The wafers WA to WC on the respective second transfer stages TRS8 to TRS10 are transferred by the interface arm E to the exposure device S4 in a predetermined sequence to be exposed. The exposed wafers WA to WC are transferred by the interface arm E to the second transfer stage TRS6 or TRS7 in accordance with the respective predetermined transfer recipes, and the wafer W on the stage TRS6 or TRS7 is transferred by the main arm A1 or A2 to the heating unit PEB1 or PEB2, the cooling unit COL1 or COL2, the developing unit and the heating unit PSOT1 or POST2 in that order in the corresponding unit block B1 or B2 to be developed. The developed wafers WA to WC are sequentially transferred to the first transfer stage TRS1 or TRS2 and returned by the transfer arm C to the original carriers 20A to 20C in the carrier block S1, respectively.

In such a resist pattern forming apparatus, the coating unit blocks B3 to B5 and the developing unit blocks B1, B2 are provided in different areas and the main arms A1 to A5 are provided in the respective unit blocks B1 to B5, so that the load of each of the main arms A1 to A5 is reduced. Accordingly, the transfer efficiency of the main arms A1 to A5 is enhanced, thereby increasing the throughput thereof.

Further, since each of the unit blocks B3 to B5 is provided with the first BARC forming unit 31, the coating unit 32 and the second BARC forming unit 33, the unit blocks B3 to B5 can be appropriately operated by correspondingly responding to any case whether the BARC is either formed or not formed by selecting the transfer recipe. In addition, even if the number of the modules is increased in order to correspond to the different types of the coating film, the modules are distributed in each of the unit blocks B3 to B5 by stacking them, so that the increase in the size of the processing block S2 can be avoided, saving the space thereof.

Meanwhile, in the case where the BARC is not formed, for example, the wafer W is transferred in the flowing path: the carrier 20→ the transfer arm C→ the first transfer stage TRS-F of the rack unit U2→ the first conveyance arm D1→ the first transfer stages TRS3 to TRS5→ the main arms A3 to A5 of the respective unit blocks B3 to B5→ the hydrophobic finishing unit ADH→ the cooling units COL32 to COL52→ the coating unit 32→ the heating units CHP32 to CHP52→ the peripheral exposure device WEE→ the second transfer stages TRS8 to TRS10→ the interface arm E→ the exposure device S4→ the interface arm E→ the second transfer stages TRS6, TRS7→ the unit blocks B1, B2.

In this case, in each of the unit blocks B3 to B5, the wafers W are independently transferred in accordance with the transfer recipe selected. For example, there may be concurrently performed the first coating film forming process in the third unit block B3, the second coating film forming process in the fourth unit block B4 and the third coating film forming process in the fifth unit block. In this way, since the different processes can be concurrently performed in the respective unit blocks, it is appropriate for handling a small quantity batch production of the coating film. The concurrent coating film forming means that the wafers W are processed in at least two of the unit blocks B3 to B5.

If, in any one of the coating unit blocks B3 to B5 or any one of the unit blocks B1 and B2, the module such as the liquid processing unit and the heating unit or the main arms A1 to A5 becomes out of order, or there occurs an operational abnormality such as a case where the wafer W cannot be transferred between the main arms A1 to A5 and the respective modules, the transfer of the wafer W in the unit block in question is stopped while the transfers of the wafers W in the other unit blocks are continued. Accordingly, the processing is continued.

In this case, the control unit 100 stores a program for stopping the main arm of one of the unit blocks when there occurs a trouble in the very unit block, a program for alarming the operator by using, e.g., an alarm, a program for outputting to the transfer arm C an instruction not to transfer the wafer W to the troubled unit block and a program for outputting to the transfer arm C an instruction to transfer the wafer W to the blocks other than the troubled unit block.

The transfer of the wafer W to the troubled unit block is stopped while the transfers of the wafers W to the other unit blocks are carried out to continue the processing. Accordingly, the coating/developing device can be operated with the other unit blocks, thereby increasing the throughput compared with the case where the coating/developing device is stopped.

In case the processing is performed with, e.g., three coating unit blocks, the wafers W are transferred to be distributed in each of the three unit blocks. Therefore, the number of the wafers W remaining in a single unit block becomes smaller than that in a case where all modules such as the coating unit, the developing unit and the heating unit are provided in a single processing block. Accordingly, even if there occurs a trouble in one unit block, the number of wafers W in the troubled unit block, which are to be retrieved since their processing is interrupted, is reduced compared with that in the case where all modules are provided in a single processing block. As a result, the burden of processing the retrieved wafers, e.g., a cleaning process, for recycling the wafers becomes reduced.

Instead of performing the processing of the wafers of the lots A, B and C in parallel as described above, it is assumed that the first coating process is first performed on the wafers WA of the lot A and the second coating process is then performed on the wafers WB of the lot B. Since the first coating film and the second coating film have different heating temperatures of the wafers W at the heating unit, in an arrangement wherein all modules such as the coating unit, the developing unit and the heating unit are provided in a same processing block, an adjustment of the heating temperature has to be carried out when the lot is switched for the first and the second coating film, for which it takes a time. As a result, there is required a time period before the processing of the wafers of the lot B is initiated after the processing of the wafers of the lot A is completed, so that the time while the apparatus is not operated becomes extended, thereby deteriorating the throughput thereof.

On the other hand, in case there are provided multiple coating unit blocks such as the coating unit blocks B3 to B5 of the present invention, the wafers W are transferred such that the first coating film is formed on the wafers WA of the lot A in any one of the unit blocks B3 to B5 and the second coating film is then formed on the wafers WB of the lot B in a block other than the unit block where the first coating film is formed, so that it is possible to adjust the temperature of the heating unit in advance in the unit block where the wafers W of the lot B are transferred. Accordingly, the processing of the wafers WB of the lot B can be initiated immediately after the processing of the wafers WA of the lot A is completed, so that there is not required a time during which the apparatus is not operated, thereby making it possible to avoid the deterioration of the throughput.

Further, in the aforementioned embodiments, a series of processes for forming the coating film prior to the exposure processing are completed in the coating unit blocks B3 to B5 and the coating film can be formed in a single unit block B3, B4 or B5. Therefore, compared with the case where the wafers W are transferred to another unit block for forming the coating film, there is no need to transfer the wafers W between the unit blocks. Accordingly, the transferring path becomes simplified, thereby increasing the transfer efficiency of the wafers W.

Moreover, the transfer arm and the transfer stages for transferring the wafers W to and from the unit blocks B1 to B5 stacked in the five layers are provided in both areas, one being an area of the processing block S2 adjacent to the carrier block S1 and another being an area of the processing block S2 adjacent to the interface block S3, so that the wafers W can be smoothly transferred in one direction as follows: the carrier block S1→ the coating unit blocks B3 to B5→ the interface block S3. Accordingly, the transferring path becomes simplified, thereby increasing the transfer efficiency.

Furthermore, since there are provided the first and the second transfer stages TRS1 to TRS10 via which the wafers W are transferred between the unit blocks and the conveyance arms D1, D2 capable of exclusively having an access thereto, the transferring system of the wafers W between the unit blocks becomes simplified.

Here, the coating unit blocks B3 to B5 and the developing unit blocks B1, B2 are configured such that the layouts of the liquid processing units, the heating units, the cooling units and the main arms between the coating unit blocks B3 to B5 and between the developing unit blocks B1 and B2 are same. Therefore, the lines for the liquid chemical such as the coating liquid and the developing liquid and the lines for the liquid drain and the gas exhaust are arranged close to each other, and the cables of electric equipments are also arranged close to each other, so that handling the lines and the cables for installment becomes simplified, thereby making the assembling process thereof easier. As a result, the time period required to manufacture the coating/developing device can be shortened and the throughput thereof is increased, thereby reducing the manufacturing cost thereof.

As described above, since the unit blocks having a same configuration can be used as the coating unit blocks and the developing unit blocks, respectively, the manufacturing process becomes easier compared with the case of manufacturing the unit blocks having different configuration, thereby decreasing the erroneous manufacture. Therefore, the manufacturing throughput is increased, thereby reducing the manufacturing cost. Further, a common member can be used, which is also attributed to the reduction of the manufacturing cost. Besides, the erroneous manufacture is reduced by employing the same unit blocks as described above, thereby resulting in a high accuracy and an easier adjustment. Accordingly, the time required for the adjustment is shortened.

In this embodiment, the transfer arm C may transfer the wafers W to and from the first transfer stages TRS1 to TRS5 of all the unit blocks B1 to B5, and the interface arm E may transfer the wafers W to and from any one of the second transfer stages TRS6 to TRS10 of the unit blocks B1 to B5.

Figure 9:
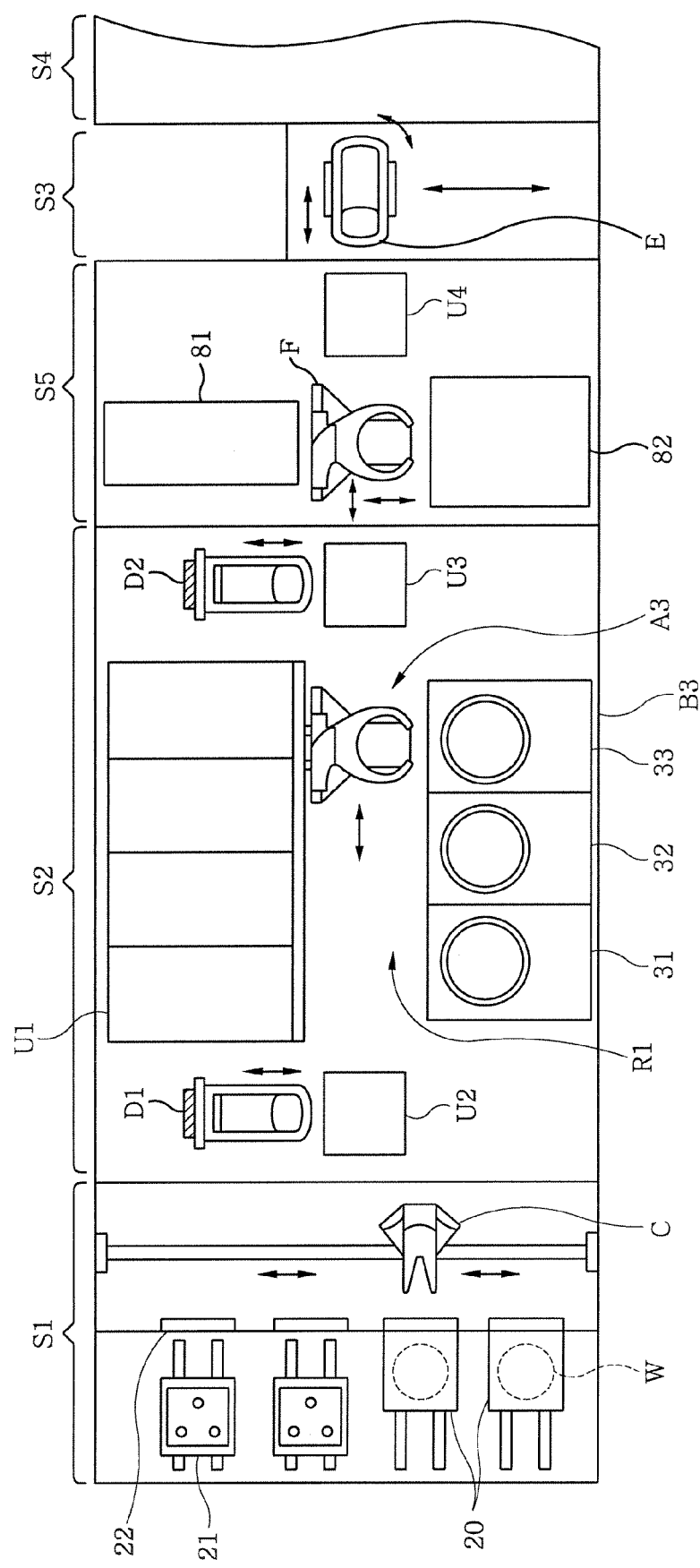
FIG. 9 is a top view of a coating/developing device in accordance with another preferred embodiment of the present invention.

Hereinafter, there will be described a second preferred embodiment of the present invention with reference to FIG. 9. In the second embodiment, there is used as the exposure device S4 a device wherein an exposure in liquid is carried out by forming a liquid layer on the surface of the wafer W and an auxiliary block S5 is provided between the processing block S2 and the interface block S3. Further, there is stacked on the fifth unit block B5 another unit block (not shown) having a unit for forming a water-repellent protection film on the second BARC. The unit for forming the water-repellent protection film corresponds to a unit for coating a water-repellent protection film serving to prevent the liquid from being immersed in the resist that is a liquid processing unit necessary for the exposure in liquid. Further, there may be provided in the unit block a cleaning unit for cleaning the protection film after the exposure and/or for cleaning and removing particles adhered to the wafer W and components that interrupt the exposure before and after the exposure.

In the auxiliary block S5, there are provided a unit for performing a process before the exposure process after the coating process and/or before and after the developing process after the exposure process, e.g. an inspection unit 81 for performing an inspection before the exposure process after the coating film is formed, or an inspection before the developing process after the exposure process and after the developing process; a cleaning unit 82 for performing, e.g., a cleaning process after the exposure in liquid; a rack unit U4 where transfer stages TRS are stacked in multi-layers, the wafer W being transferred between the transfer stages TRS and the interface arm E of the interface block S3; and a third conveyance arm F for transferring the wafer W between the transfer stages TRS6 to TRS10 of the rack unit U3 of the processing block S2, the inspection unit 81, the cleaning unit 82, and each part of the rack unit U4. The inspection unit 81 and/or the cleaning unit 82 may be configured in multi-layers, and only the cleaning unit 82 or the inspection unit 81 may be disposed on both sides of the third conveyance arm F. The arrangement thereof has no limitation.

The third conveyance arm F is movable back and forth and up and down and rotatable about its vertical axis. Further, the inspection performed before the coating process includes an inspection for the thickness of the coating film and an inspection for foreign materials, and the inspection performed before the developing process after the exposure process includes an inspection for the exposure overlap. The present invention is not limited to the above, there may be provided a unit for detecting an alignment mark on the substrate and a unit for removing a part of the film by using a laser.

Furthermore, as the unit provided in the auxiliary block, there may be provided at least one of a unit for inspecting the status of the wafer's surface, e.g., a thickness inspection unit for inspecting the thickness of the coating film formed on the wafer, a device for detecting a non-uniform coating of the resist liquid, a cleaning unit for cleaning the substrate before and after the exposure, a defocus inspection device for detecting misalignment of the pattern caused in the exposure device, a poor developing detection device for detecting a poor developing, a particle detection device for detecting the number of particles adhered to the wafer W, a comet detection device for detecting comets generated on the wafer W after the resist coating due to vapor and foreign materials in the resist liquid, a splash back detection device for detecting splash back that the solvent of the resist liquid released from the surface of the wafer W is again attached to the wafer W, a common defect detection device for detecting common defects appearing in a same pattern on a same location of the wafer's surface, a residual detection device for detecting resist residuals remaining on the wafer W, a resist and/or develop status detection device (poor status detection device) for detecting a poor status wherein the coating and/or the developing is not performed, a line-width measuring device for measuring a line-width of the resist film formed on the wafer W, and an overlap detection device for inspecting an overlap precision between the wafer W exposed by the exposure device and the photo mask in comparison with a standard value.

The defocus detection is to detect the defocus in the exposure device in comparison with a pre-registered correct pattern, the line-width measuring device serves to measure whether or not the exposure amount and the exposure time in the exposure device are proper in comparison with the pre-registered correct pattern, and the overlap detection device serves to detect misalignment of the exposure position in the exposure device by comparing a pattern at a specific location, which can be compared with a pattern of an underlying layer, with the pre-registered correct pattern.

With such arrangements, in case the wafer W is subjected to the cleaning process after the exposure, similarly to the first preferred embodiment described above, the wafer W is transferred to the unit block, where the water-repellent protection film is formed, after the second BARC is formed at the coating unit blocks B3 to B5, and is then transferred through the second transfer stage of the rack unit U3 in the following path: the third conveyance arm F of the auxiliary block S5→ the transfer stage of the rack unit U4→ the interface arm E of the interface block S3→ the exposure device S4. The exposed wafer W is then transferred in the following path: the interface arm E of the interface block S3→ the transfer stage of the rack unit U4 of the auxiliary block S5→ the third conveyance arm F→ the cleaning unit 82→ the third conveyance arm F→ the transfer stage TRS6 or TRS7 of the rack unit U3→ the main arm At or A2→ unit block B1 or B2. The rack unit U4 may be configured such that a plurality of wafers W can be stocked therein before and after the exposure, and in this case, it is used for the same purpose as the buffer 83 provided in the interface block S3.

In case of performing various inspections, desired inspections are performed on the wafers W taken out lot by lot (one lot including a predetermined number of wafers). For example, in case of the inspection after the coating film is formed, the wafer is inspected at the auxiliary block S5 before being transferred to the exposure device S4. In case of the inspection after the exposure, an inspection is performed on the wafer W returned to the auxiliary block S5 from the exposure device S4. Further, in case of the inspection after the developing process, after being developed at the processing block S2, the wafer W is transferred to the auxiliary block S5 and is then inspected.

Here, the reason of forming the water-repellent protection film on the second BARC is for repelling liquid by the protection film upon the exposure in liquid such that it is difficult for the liquid to remain on the surface of the wafer W. For example, the water-repellent protection film is formed on the surface and the backside peripheral portion of the wafer W. Further, the cleaning process after the exposure in liquid is performed to remove the protection film in order to prevent the protection film from being a cause of particle generation when peeled off the wafer W. For example, the cleaning process includes supplying a liquid chemical for removing the protection film to the surface and the backside peripheral portion of the wafer W to remove the protection film, and supplying a cleaning liquid for cleaning the liquid chemical.

In this embodiment, since there is provided between the processing block S2 and the interface block S3 the auxiliary block S5 including the inspection unit and the cleaning unit, the inspection and the cleaning can be performed in the passage for the wafer W between the processing block S2 and the interface block S3, e.g., in the case of performing the inspection and the cleaning before the exposure process after the coating film is formed, in the case of performing the inspection and the cleaning before the developing process after the exposure process, and/or in the case of performing the inspection and the cleaning after the developing process. Accordingly, the inspection and the cleaning can be performed at an appropriate timing after the developing process, after the coating process and the exposure process, while preventing the transferring path for the wafer W being complicated. Further, the complication of the transferring path can be suppressed during the inspection and the cleaning.

In this embodiment, in case that no BARC is formed, the protection film may be formed on the resist film and the cleaning process may be performed before and/or after the exposure process. Further, in case there is no protection film, the cleaning unit 82 serves merely to remove the contaminants on the wafer W.

Figure 10:
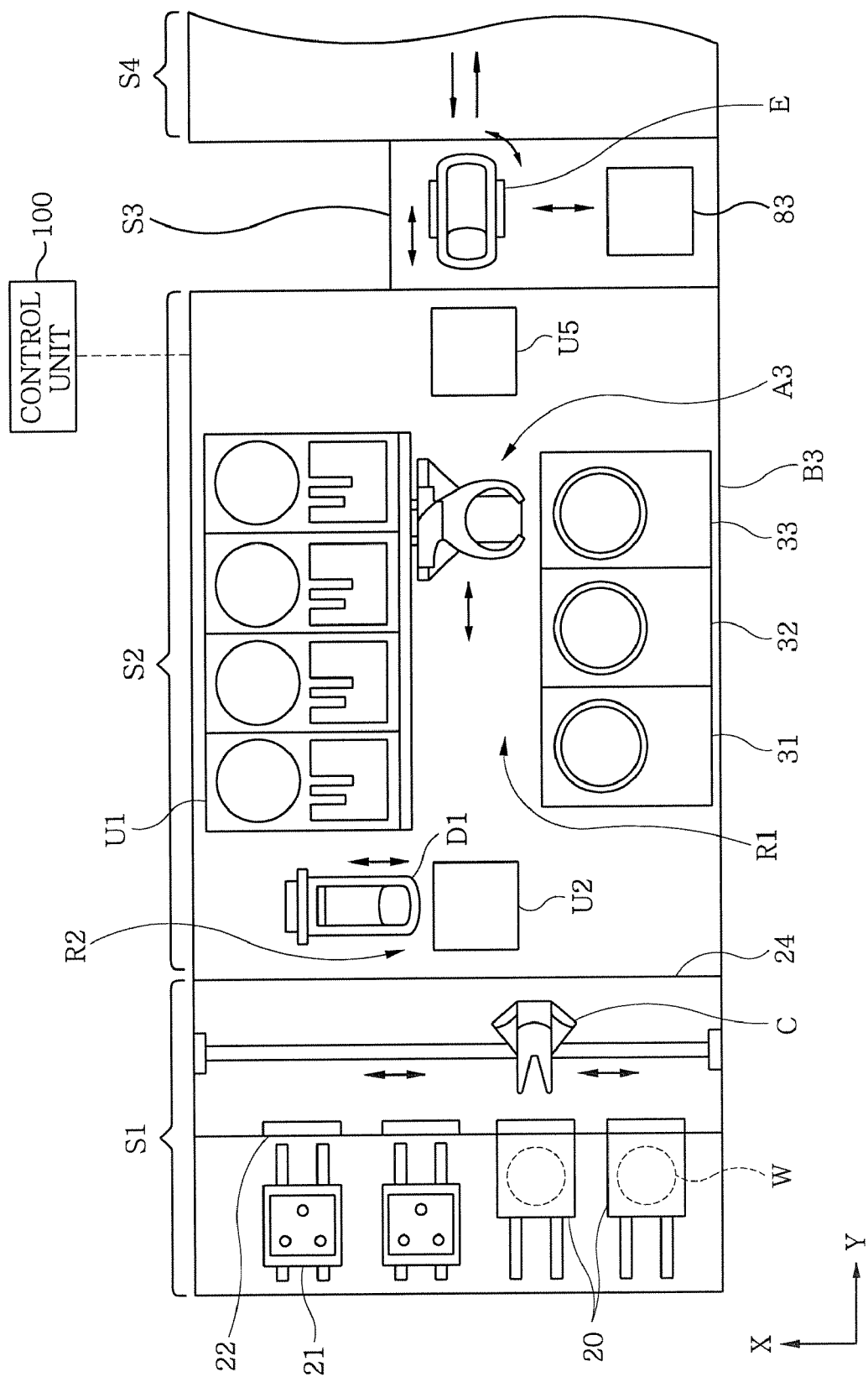
FIG. 10 shows a top view of a coating/developing device in accordance with still another preferred embodiment of the present invention.
Figure 11:
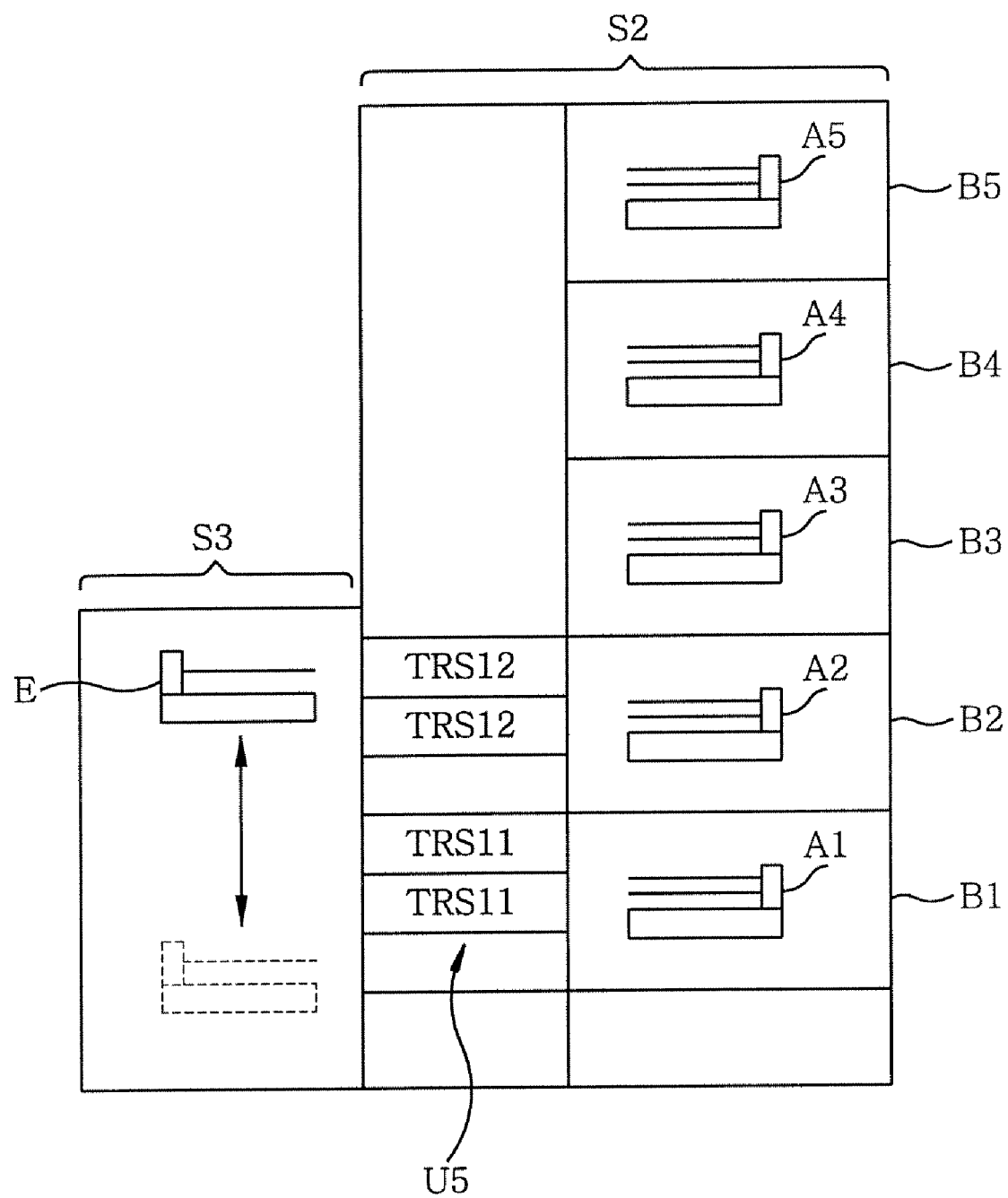
FIG. 11 is a side sectional view of a processing block and an interface block in the coating/developing device shown in FIG. 10.
Figure 12:
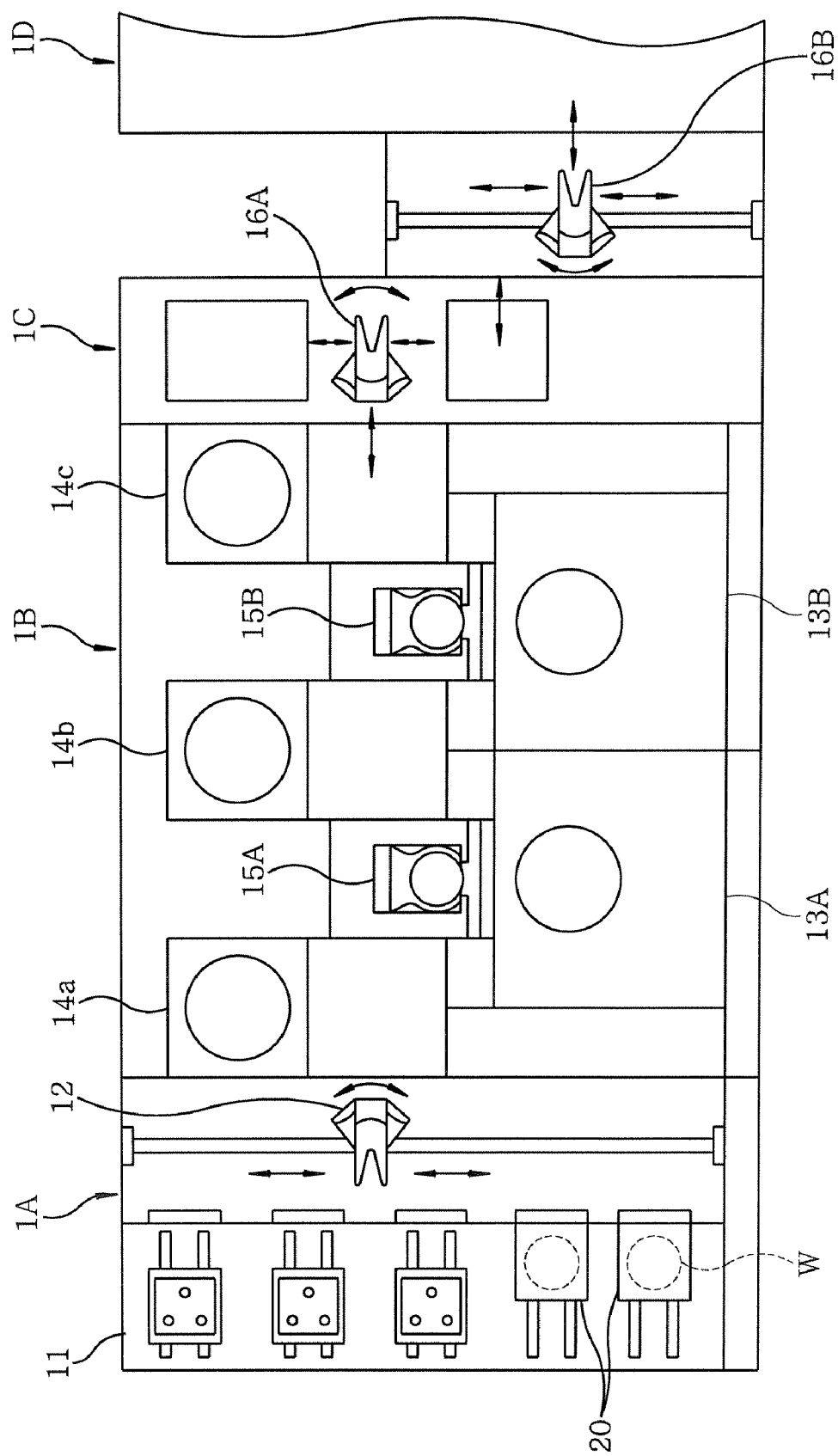
FIG. 12 shows a plan view of a conventional coating/developing device.

In the present invention as described above, the wafer W may be transferred by any one of the first and the second conveyance arms D1 and D2 between the first to fifth unit blocks B1 to B5. FIGS. 10 and 11 show the third unit block B3 in a case where the wafer W is transferred only by the first conveyance arm D1 between the five layers of the unit blocks B1 to B5.

This embodiment has the same configuration as that of the aforementioned embodiments except that there is provided only the first conveyance arm D1, the second transfer stages TRS11, TRS12 are provided only in the developing unit blocks B1, B2 and the wafer W is transferred through the unit blocks B1, B2 between the carrier block S1 and the interface block S3. In FIGS. 10 and 11, reference character U5 represents a rack unit including a second transfer stages group formed by stacking the second transfer stages in multi-layers. There are provided one or more, e.g., two, second transfer stages TRS11, TRS12 in each of the first and the second unit block B1, B2, and the transfer stages TRS11, TRS12 correspond to the transfer stages for the interface block.

There will now be described briefly a transfer flow of the wafer W in the resist pattern forming apparatus. First, the wafer W is taken out by the transfer arm C from the carrier 20 loaded in the carrier block S1 and then transferred to the transfer stages TRS-F of the second unit block B2. Subsequently, the wafer W is transferred by the first conveyance arm D1 to the first transfer stages TRS3 to TRS5 and then by the main arms A3 to A5 to the coating unit blocks B3 to B5.

In the coating unit blocks B3 to B5, the wafer W is sequentially transferred to the respective modules in order to form the coating film including the resist film as described above. The wafer W having the coating film thereon is transferred to the transfer stages TRS3 to TRS5.

Subsequently, the wafer W on the transfer stages TRS3 to TRS5 is transferred by the first conveyance arm D1 to the transfer stages TRS1, TRS2 and then by the main arms A1, A2 of the unit blocks B1, B2 to the second transfer stages TRS6, TRS7 in the corresponding unit blocks B1, B2. The wafer W on the transfer stages TRS6, TRS7 is transferred by the interface arm E to the exposure device S4 where it is subjected to the exposure process.

The exposed wafer W is transferred by the interface arm E to the second transfer stages TRS6, TRS7 and then received by the main arms A1, A2 of the unit blocks B1, B2 to be developed. Thus developed wafer W is transferred to the first transfer stages TRS1, TRS2 and then returned by the transfer arm C to the original carrier 20 in the carrier block S1.

In this case, the transfer arm C may be configured to have an access to the first transfer stage of each of the unit blocks B1 to B5 to transfer the wafer W to and from the unit blocks B3 to B5.

In such a coating/developing device, as similarly to the above-described embodiments, by providing the dedicated main arms A1 to A5 in the respective unit blocks B1 to B5, the transfer efficiency of the main arms A1 to A5 can be improved, thereby increasing the throughput thereof. Further, each of the coating unit blocks B3 to B5 can properly operate by correspondingly responding to a case where the BARC is either formed or not formed and a case where the coating films of different types are formed while saving the space occupied by the processing block S2. Moreover, in one of the coating unit blocks B3 to B5, a series of processes for forming the coating film are completed, so that the transferring path of the wafer W is simplified, increasing the transfer efficiency.

Furthermore, even when there occurs a trouble during the processing in any one of the coating unit blocks B3 to B5 or in any one of the unit blocks B1 and B2, it is possible to continue the processing in the other unit blocks, thereby increasing the throughput compared with the case where the coating/developing device is stopped altogether. In addition, since the number of the wafers W remaining in the troubled unit block becomes small, the number of the wafers W retrieved from the processing is decreased, thereby decreasing the burden of processing the wafers W in order to recycle the wafers W. Moreover, in a case where the first coating film is formed on the wafers WA of a lot A and a second coating film is then formed on the wafers WB of a lot B, the processing of the wafers WB of the lot B can be initiated immediately after the processing of the wafers WA of the lot A is completed, so that the time during which the apparatus is not operated is shortened, thereby suppressing the deterioration of the throughput.

Here, by using the unit blocks having a same configuration as the coating unit blocks B3 to B5 and the developing unit blocks B1, B2, respectively, the manufacturing process can be easier, the manufacturing throughput can be increased, the manufacturing cost can be reduced, and the adjustment can be easier.

In this embodiment, there is provided only in the developing unit blocks B1, B2 the transferring area R1 connecting the carrier block S1 to the interface block S3, and the wafer W is transferred only by the conveyance arm D1 between the coating unit blocks B3 to B5 and the developing unit blocks B1, B2. Accordingly, the transfer system becomes simplified.

At this time, as the transfer stage for the interface block used in transferring the wafer W between the processing block S2 and the interface block S3, there are provided the transfer stages TRS11, TRS12 of the developing unit blocks B1, B2. Accordingly, the access range and the movement range of the interface arm E become smaller. In this way, the access of the transfer system and the apparatus become simplified, thereby making it easy to control the transfer units.

In this embodiment, the wafer W may be made to be transferred only by the second conveyance arm D2 between the developing unit blocks B1, B2 and the coating unit blocks B3 to B5. In this case, there are provided in the rack unit U1 the transfer stages for the carrier block which are used in transferring the wafer W between the carrier block S1 and the developing unit blocks B1, B2. Further, the rack unit U5 is provided with the second transfer stages for the respective unit blocks B1 to B5 and the transfer stages for the interface block which are used in transferring the wafer W between the interface block S3 and the developing unit blocks B1, B2.

Further, in this case, the wafer W may be transferred between the unit blocks B3 to B5 and the interface arm E by making the interface arm E have an access to the second transfer stages of the respective unit blocks B1 to B5.

In this embodiment, the wafer W may be allowed to be transferred through only any one of the unit blocks B3 to B5 between the carrier block S1 and the interface block S3. Specifically, there will be described as an example a case where for the coating unit blocks B3 to B5, the wafer w is transferred between the carrier block S1 and the interface block S2, and the wafer W is transferred by the first conveyance arm D1 between the unit blocks B1 to B5.

In this case, each of the coating unit blocks B3 to B5 is provided with the transfer stages for the carrier block and the transfer stages for the interface block. In this embodiment, the wafer W in the carrier block S1 is loaded through the transfer stages of any one of the coating unit blocks B3 to B5 into the corresponding unit block B3, B4 or B5 where a coating film is formed thereon. The wafer W is then transferred through the transfer stage for the interface block of the corresponding unit block B3, B4 or B5 to the exposure device S4 by the interface arm E.

Meanwhile, the exposed wafer W is loaded through the transfer stage of any one of the unit blocks B3 to B5 into the corresponding unit block B3, B4 or B5, and is then transferred through the first transfer stage to the unit block B1 or B2 for the developing process by the first conveyance arm D1. The developed wafer W is transferred through the first transfer stage to the transfer stage provided in the coating unit block B3, B4 or B5 and then to the carrier block S1 by the first conveyance arm D1.

Here, the transfer stage for the interface block may be provided in each of the unit blocks B1 to B5. Further, the transfer stages for the carrier block and the interface block may be provided in at least one of the coating unit blocks B3 to B5, and may be provided in the other coating unit blocks.

In this embodiment, the transfer of the wafer W between all of the unit blocks B1 to B5 may be carried out only by a combination of the transfer stages provided on the side of the interface block and the transfer arm capable of having an access thereto.

In the present invention, the wafer W may be transferred only to the developing unit blocks B1, B2 to be processed. Further, the developing unit blocks may be arranged in a single layer, and the coating unit blocks may be arranged in a plurality of layers other than three layers. In this embodiment, as the transfer stages for the carrier block accessible by the transfer arm C, any one may be employed as long as the wafer W can be transferred by the transfer arm C to and from at least one of the stacked unit blocks therethrough. Furthermore, by providing in the rack units U2, U5 the second transfer stages for the transfer of the wafer W by the interface arm E, the wafer W may be transferred through the second transfer stage TRS between the respective unit blocks B1 to B5 and the interface block S2.

One or more transfer stages may be provided in each of the rack units U1, U2 and U5 of the respective unit blocks, and may have a cooling function. Further, in the unit block where the wafer W is transferred between the carrier block and the interface block S3, there may be provided a dedicated transfer unit other than the main arms A1 to A5 for transferring the wafer W between the transfer arm C and the interface arm E or between the rack unit U1 and the rack unit U2 or U5. Moreover, in the rack unit U1 or U5, there may be provided a module other than the transfer stage, e.g., a cooling unit, and as a processing unit of the unit blocks B1 to B5 stacked in the processing block S2, an inspection unit may be provided depending on the purpose thereof. For example, the coating unit blocks B3 to B5 may be provided with a measurer for film thickness, and the developing unit blocks B1, B2 may be provided with a pattern overlap inspection unit and/or a develop inspection unit for inspecting the developed status after the developing process. In addition, the unit block may be provided with an inspection unit. In this case, the inspection unit may be provided on both sides of the transferring path of the main arms A1 to A5, and a dedicated unit block for the inspection unit. The present invention may be applied to a coating/developing device for processing a substrate such as a glass substrate for liquid crystal display (LCD substrate) as well as the semiconductor wafer.

While the invention has been shown and described with respect to the preferred embodiments, it will be understood by those skilled in the art that various changes and modification may be made without departing from the scope of the invention as defined in the following claims.

What is claimed is:

1. A coating/developing device in which a substrates loaded through a carrier into a carrier block is transferred to a processing block where a coating film including a resist film is formed on each of the substrates, and are then transferred through and interface block connected to an opposing side of the carrier block with respect to the processing block to an exposure device and returned through the interface block to the processing block, each of exposed substrates being developed at the processing block and then transferred to the carrier block, wherein:

a) the processing block includes a plurality of coating unit blocks and a developing unit block stacked on one another, each of the substrates from the carrier block being loaded into one of the coating unit blocks;
  b) each of the coating unit blocks and the developing unit block includes a transferring area, that connects the carrier block to the interface block, extended in a longitudinal direction of said each of the coating unit blocks and the developing unit block, a liquid processing unit that coats a liquid chemical on a substrate, a heating unit that heats the substrate, a cooling unit that cools the substrate and a transfer configured to move back and forth in the longitudinal direction along the transferring area to transfer the substrate among the liquid processing unit, the heating unit and the cooling unit; and
  c) the liquid processing unit provided in each of the coating unit blocks includes a coating unit that coats a resist liquid on the substrate and a bottom antireflection coating (BARC) forming unit that coats a liquid chemical for a BARC on the substrate after the resist liquid is coated thereon, wherein the processing that forms the coating film including the resist film on each of the substrates is performed in one of the coating unit blocks.

2. The device of claim 1, further comprising a control unit for controlling the device such that in case there occurs an abnormality in any one of the coating unit blocks, the substrates are not transferred into the abnormal coating unit block while the substrates are allowed to be transferred into the other coating unit blocks.

3. The device of claim 1, further comprising a first transfer stage group provided on the side of the carrier block in each of the coating unit blocks and the developing unit block, the first transfer stage group including first transfer stages stacked which are used in transferring each of the substrates between the transfer units of the respective coating unit blocks and the developing unit block;
  and a first substrate transfer unit for transferring each of the substrates between the first transfer stages.

4. The device of claim 3, further comprising a second transfer stage group provided on the side of the interface block in each of the coating unit blocks and the developing unit block, the second transfer stage group including second transfer stages stacked which are used in transferring each of the substrates between the transfer units of the respective coating unit blocks and the developing unit block;
  and a second substrate transfer unit for transferring each of the substrates between the second transfer stages.

5. The device of claim 3, wherein the first transfer stage group includes a transfer stage for the transfer of each of the substrate between the carrier block and the processing block.

6. The device of claim 5, further comprising a transfer arm that transfers each of the substrates between the carrier and the transfer stage.

7. The device of claim 3, wherein there is provided between the processing block and the interface block an auxiliary block provided with a unit for performing a process on each of the substrate substrates before performing an exposure process after forming the coating film thereon and/or before and after performing a developing process after the exposure process.

8. The device of claim 1, further comprising a second transfer stage group provided on the side of the interface block in each of the coating unit blocks and the developing unit block, the second transfer stage group including second transfer stages stacked which are used in transferring the substrate between the transfer units of the respective coating unit blocks and the developing unit block;
  and a second substrate transfer unit for transferring each of the substrates between the second transfer stages.

9. The device of claim 8, wherein the second transfer stage group includes a transfer stage for the transfer of each of the substrates between the interface block and the processing block.

10. The device of claim 9, wherein there is provided between the processing block and the interface block an auxiliary block provided with a unit for performing a process on each of the substrates before performing and exposure process after forming the coating film thereon and/or before and after performing a developing process after the exposure process.

11. The device of claim 1, wherein there is provided between the processing block and the interface block an auxiliary block provided with a unit for performing a process on each of the substrate before performing an exposure process after forming the coating film thereon and/or before and after performing a developing process after the exposure process.

12. The device of claim 11, wherein the unit provided in the auxiliary block includes at least one of a thickness inspection unit for inspecting a thickness of the coating film formed on each of the substrate in order to inspect the status of the surface of the substrates; a cleaning unit for cleaning the substrates before and/or after the exposure process; a defocus inspection device for detecting misalignment of the pattern caused in the exposure device; a device for detecting a non-uniform coating of the resist liquid; a particle detection device for detecting the number of particles adhered to the substrate; a comet detection device for detecting comets generated on each of the substrates after the resist coating; a splash back detection device; a defect detection device for detecting defects on the substrate; a residual detection device for detecting resist residuals remaining on each of the substrates after the developing process; a poor status detection device for detecting a poor status in the coating and/or the developing; a line-width measuring device for measuring a line-width of the resist film formed each of exposed substrates and a photo mask.

13. The device of claim 12, wherein the exposure device is to perform an exposure in liquid by forming a liquid layer on the surface of the substrate, and the unit provided in the auxiliary block is the cleaning unit for cleaning unit for cleaning each of the substrates after each of the substrates is exposed in liquid.

14. The device of claim 13, wherein a coating unit block, for forming a water-repellent protection film on the resist film of each of the substrates, is further stacked on the coating unit blocks stacked.

15. The device of claim 1, further comprising:
a control unit that stores a plurality of transfer recipes showing transferring paths of the substrates in the coating unit blocks and performs a process of forming the coating film on each of the substrates based on a selected recipe, wherein a type of the coating film is determined based on the selected recipe.

16. The device of claim 1, wherein each of the coating unit blocks further includes a peripheral edge exposure device for selectively exposing only an edge portion of each of the substrates.

17. A coating/developing method employed in a coating/developing device described in claim 1, the method comprising the sequential steps of:
(a) loading the substrate from the carrier block into one of the coating unit blocks;
(b) transferring, by the transfer unit in said one of the coating unit blocks, the substrate to the liquid processing unit provided in said one of the coating unit blocks to form at least the resist film on the substrate;
(c) transferring the substrate from said one of the coating unit blocks to an exposure device via the interface block;
(d) performing an exposure process in the exposure device;
(e) transferring each of the substrates exposed by the exposure device to the developing unit block via the interface block;
(f) transferring, by the transfer unit provided in the developing unit block, each of the substrates to the liquid processing unit provided in the developing unit block to develop each of the exposed substrates; and
(g) unloading each of the substrates from the developing unit block to the carrier block,
wherein the step (b) is independently performed in one of the coating unit blocks.

18. The method of claim 17, the method further comprising the step of:
(i) cleaning, in an auxiliary block provided between the processing block and the interface block, the substrate before performing the exposure process after forming the coating film and/or before and after performing a developing process in the developing unit block after performing the exposure process.

19. The method of claim 17, the method further comprising the step of:
(h) stopping the transfer of the substrates into one of the coating unit blocks while allowing the substrates to be transferred into the other coating unit blocks, in case there occurs an abnormality in the same one of the coating unit blocks.

* * * * *